(12) United States Patent
Chou et al.

(10) Patent No.: US 11,764,733 B2
(45) Date of Patent: Sep. 19, 2023

(54) C-PHY RECEIVER WITH SELF-REGULATED COMMON MODE SERVO LOOP

(71) Applicant: QUALCOMM Incorporated, San Diego, CA (US)

(72) Inventors: Shih-Wei Chou, San Diego, CA (US); Todd Morgan Rasmus, Cary, NC (US); Ying Duan, San Diego, CA (US); Abhay Dixit, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 117 days.

(21) Appl. No.: 17/483,142

(22) Filed: Sep. 23, 2021

(65) Prior Publication Data
US 2023/0087897 A1 Mar. 23, 2023

(51) Int. Cl.
| | | |
|---|---|---|
| *H03F 1/02* | (2006.01) | |
| *H03F 3/19* | (2006.01) | |
| *H03F 3/193* | (2006.01) | |
| *H04B 1/16* | (2006.01) | |
| *H04L 69/323* | (2022.01) | |
| *H05K 1/02* | (2006.01) | |

(52) U.S. Cl.
CPC ............ *H03F 1/0261* (2013.01); *H03F 3/19* (2013.01); *H03F 3/193* (2013.01); *H04B 1/16* (2013.01); *H04L 69/323* (2013.01); *H05K 1/0246* (2013.01); *H03F 2200/451* (2013.01)

(58) Field of Classification Search
CPC .......... H03F 1/0261; H03F 3/19; H03F 3/193; H03F 2200/451; H04B 1/16; H04L 69/323; H04L 2012/5615; H04Q 2213/202; H05K 1/0246; H03K 2005/00117; H04J 2203/0048
See application file for complete search history.

(56) References Cited

U.S. PATENT DOCUMENTS

| | | | |
|---|---|---|---|
| 2007/0103186 A1* | 5/2007 | Clements | ............ H04L 25/0278 |
| | | | 326/30 |
| 2015/0381340 A1 | 12/2015 | Pandey et al. | |
| 2017/0039929 A1 | 2/2017 | Wiley | |
| 2019/0087373 A1 | 3/2019 | Kim et al. | |

OTHER PUBLICATIONS

International Search Report and Written Opinion—PCT/US2022/042932—ISA/EPO—dated Dec. 7, 2022.

* cited by examiner

*Primary Examiner* — Jung Kim
(74) *Attorney, Agent, or Firm* — Loza & Loza, LLP

(57) ABSTRACT

A receiving apparatus includes a terminating network for a three-wire serial bus and a feedback circuit. Each wire of the three-wire serial bus may be coupled through a resistance to a common node of the terminating network. The feedback circuit has a first amplifier circuit having an input coupled to the common node, a comparator that receives an output of the first amplifier circuit as a first input and a reference voltage as a second input, and a second amplifier circuit responsive to an output of the comparator and configured to inject a current through the common node.

29 Claims, 15 Drawing Sheets

Example 2: 150mV Center, 150mV Peak-to-Peak

C-PHY RECEIVER WITH SELF-REGULATED COMMON MODE SERVO LOOP

TECHNICAL FIELD

The present disclosure relates generally to high-speed data communication interfaces, and more particularly, to improving reliability of data decoding over a multi-wire, multi-phase data communication link.

BACKGROUND

Manufacturers of mobile devices, such as cellular phones, may obtain components of the mobile devices from various sources, including different manufacturers. For example, an application processor in a cellular phone may be obtained from a first manufacturer, while an imaging device or camera may be obtained from a second manufacturer and a display controller may be obtained from a third manufacturer. The application processor, the imaging device, the display controller, or other types of devices may be interconnected using a standards-based or proprietary physical interface. In one example, an imaging device may be connected using the Camera Serial Interface (CSI) defined by the Mobile Industry Processor Interface (MIPI) Alliance. In another example, a display controller may include an interface that conforms to the Display Serial Interface (DSI) standard specified by the Mobile Industry Processor Interface (MIPI) Alliance. A multiphase three-wire (C-PHY) interface defined by the MIPI Alliance uses a trio of conductors to transmit information between devices. Each of the three wires may be in one of three signaling states during transmission of a symbol over the C-PHY interface. Clock information is encoded in a sequence of symbols transmitted on the C-PHY interface and a receiver generates a clock signal from transitions between consecutive symbols. The maximum speed of the C-PHY interface and the ability of a clock and data recovery (CDR) circuit to recover clock information may be limited by the maximum time variation related to transitions of signals transmitted on the different wires of the communication link, which can limit the data throughput provided by the C-PHY interface as demand for increased data throughput continue to increase.

SUMMARY

Certain aspects of this disclosure relate to systems, methods and apparatus that enable improved communication on a multi-wire and/or multiphase communication link by managing voltage levels of signals received from the communication link. In some aspects, a feedback circuit provides an injection current to a common node of a terminating network in order to control a common mode voltage associated with the communication link.

In one aspect of the disclosure, a receiving apparatus includes a terminating network for a three-wire serial bus and a feedback circuit. Each wire of the three-wire serial bus may be coupled through a resistance to a common node of the terminating network. The feedback circuit has a first amplifier circuit having an input coupled to the common node, a comparator that receives an output of the first amplifier circuit as a first input and a reference voltage as a second input, and a second amplifier circuit responsive to an output of the comparator and configured to inject a current through the common node.

In one aspect of the disclosure, an apparatus includes means for terminating a three-wire serial bus, configured to couple each wire of the three-wire serial bus through a resistance to a common node; and means for regulating a common mode voltage level. The means for terminating a three-wire serial bus is configured to couple each wire of the three-wire serial bus through a resistance to a common node of the terminating network. The means for regulating a common mode voltage level includes a feedback circuit having a first amplifier circuit having an input coupled to the common node, a comparator that receives an output of the first amplifier circuit as a first input and a reference voltage as a second input, and a second amplifier circuit responsive to an output of the comparator and configured to inject a current through the common node.

In one aspect of the disclosure, a method for regulating a common mode voltage at a receiver includes providing a terminating network for a three-wire serial bus and configuring a feedback circuit. Each wire of the three-wire serial bus is coupled through a resistance to a common node of the terminating network. The feedback circuit includes a first amplifier circuit having an input coupled to the common node, a comparator that receives an output of the first amplifier circuit as a first input and a reference voltage as a second input, and a second amplifier circuit responsive to an output of the comparator and configured to inject a current through the common node.

In some aspects, the three-wire serial bus is operated in accordance with a C-PHY protocol. The terminating network may include a capacitance configured to couple the common node to ground. In some aspects, the receiving apparatus includes a plurality of differential receivers coupled to different pairs of wires of the three-wire serial bus. The first amplifier circuit has a combination of active devices that matches a corresponding combination of active devices in an amplifier in each of the plurality of differential receivers. The first amplifier circuit and the second amplifier circuit may include tunable transistors configured to set a voltage level at the common node. The feedback circuit may be configured to regulate a voltage level at the common node based on amplitude of the injection current. The voltage level at the common node may be calibrated during transmission of a preamble over the three-wire serial bus in accordance with a C-PHY protocol. The voltage level at the common node may be calibrated to be less than half a nominal peak-to-peak voltage of a signal to be transmitted by a transmitter over the three-wire serial bus.

In certain aspects, the apparatus has a third amplifier configured with an automatic frequency equalization circuit. The third amplifier may include a plurality of N-type metal-oxide-semiconductor input transistors and a source degeneration circuit.

DETAILED DESCRIPTION

Figure 1:
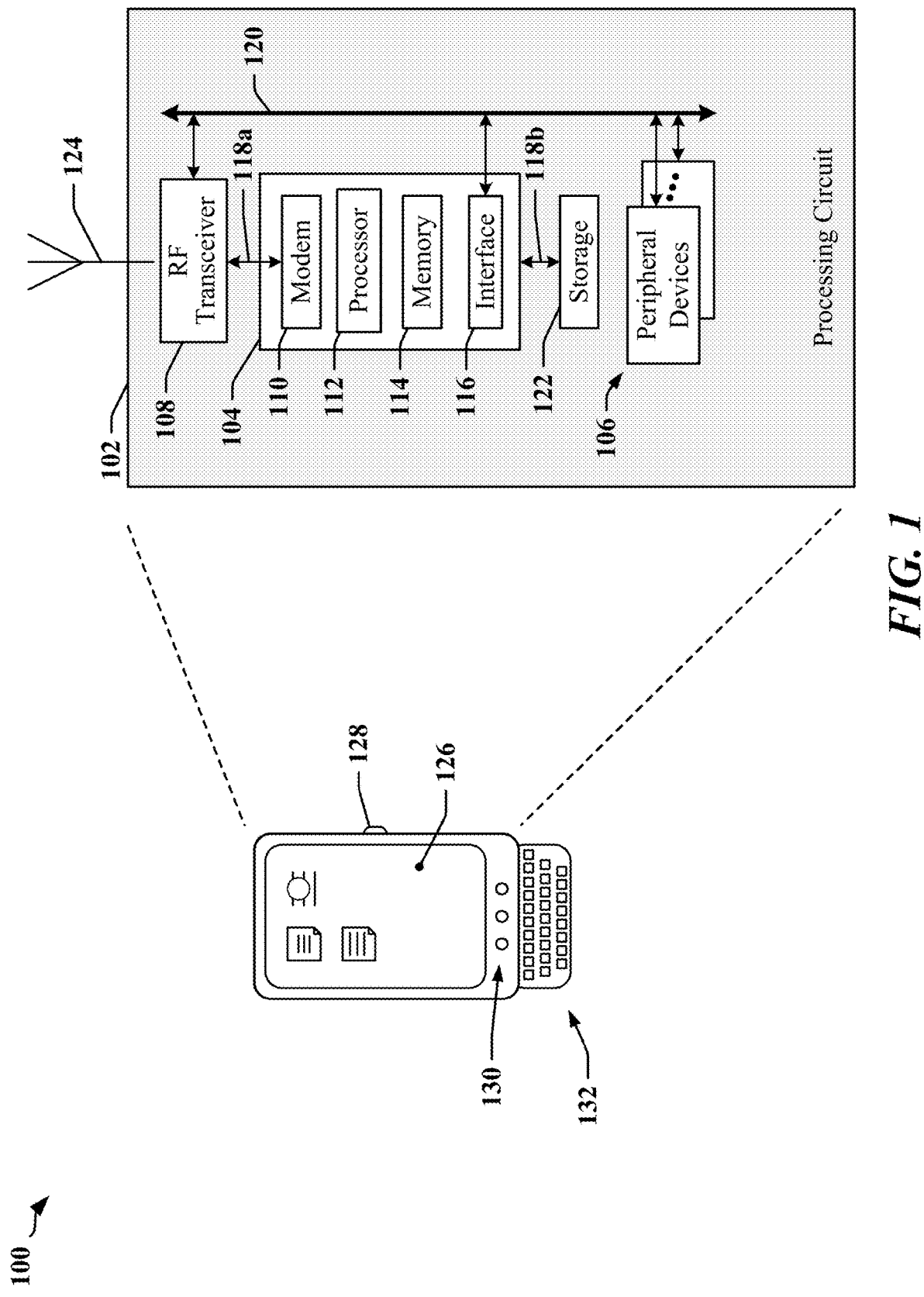
FIG. 1 depicts an apparatus employing a data link between integrated circuit (IC) devices.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various processor-readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Certain aspects of the invention may be applicable to improving a C-PHY interface specified by the MIPI Alliance, which is often deployed to connect electronic devices that are subcomponents of a mobile apparatus such as a telephone, a mobile computing device, an appliance, automobile electronics, avionics systems, etc. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a wearable computing device (e.g., a smartwatch, a health or fitness tracker, etc.), a drone, a sensor, a vending machine, or any other similarly functioning device.

In various aspects of the disclosure, a data communication apparatus has a plurality of line drivers configured to couple the apparatus to a 3-wire link, and a data encoder configured to encode at least 3 bits of binary data in each transition between two symbols that are consecutively transmitted by the plurality of line drivers over the 3-wire link such that each pair of consecutively-transmitted symbols includes two different symbols. Each symbol defines signaling states of the 3-wire link during an associated symbol transmission interval such that each wire of the 3-wire link is in a different signaling state from the other wires of the 3-wire link during the associated symbol transmission interval. Data may be encoded in a combination of phase and polarity. The apparatus may include a wire state encoder configured to receive a sequence of symbols from the data encoder, and provide control signals to the plurality of line drivers. The control signals cause each of the plurality of line drivers to drive one wire of the 3-wire link to a signaling state defined by each symbol during a symbol transmission interval provided for each symbol in the sequence of symbols.

The C-PHY interface is a high-speed serial interface that can provide high data throughput over bandwidth-limited channels. The C-PHY interface may be deployed to connect application processors to peripherals, including display controllers and cameras. The C-PHY interface encodes data into symbols that are transmitted in a three-phase signal over a set of three wires, which may be referred to as a trio of wires, or simply as a trio. The three-phase signal is transmitted in a different phase on each wire of the trio. Each trio provides a lane on a communication link. A symbol interval may be defined as the interval of time in which a single symbol controls the signaling state of a trio. During each symbol interval in a conventional C-PHY interface, one wire is "undriven" or driven to a mid-level voltage state while the remaining two of the three wires are differentially driven such that one of the two differentially driven wires assumes a first voltage level and the other differentially driven wire assumes to a second voltage level different from the first voltage level. In some implementations, the third wire is undriven or floating such that it assumes a third voltage level that is at or near the mid-level voltage between the first and second voltage levels due to the action of terminations. In some implementations, the third wire is driven toward the mid-level voltage. In one example, the driven voltage levels may be +V and −V with the undriven voltage being 0. In another example, the driven voltage levels may be +V and 0 with the undriven voltage being +V/2. Different symbols are transmitted in each consecutively transmitted pair of symbols, and different pairs of wires may be differentially driven in different symbol intervals. In C-PHY interfaces, clock information is encoded in the transitions of signaling state at symbol boundaries between consecutive symbol intervals.

FIG. 1 depicts an example of apparatus 100 that may employ C-PHY 3-phase protocols to implement one or more communication links. The apparatus 100 may include a system on Chip (SoC), or a processing circuit 102 that has multiple circuits or devices 104, 106 and/or 108, which may be implemented in an application specific integrated circuit (ASIC). In one example, the apparatus 100 may operate as a communication device and the processing circuit 102 may include a processing device provided in an ASIC 104, one or more peripheral devices 106, and a transceiver 108 that enables the apparatus to communicate through an antenna 124 with a radio access network, a core access network, the Internet and/or another network.

The ASIC 104 may have one or more processors 112, one or more modems 110, on-board memory 114, a bus interface circuit 116 and/or other logic circuits or functions. The processing circuit 102 may be controlled by an operating system that may provide an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114, the processor-readable storage 122 may include read-only memory (ROM) or random access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 124, a display 126, operator controls, such as switches or buttons 128, 130 or external keypad 132, among other components. A user interface module may be configured to operate with the display 126, external keypad 132, etc. through a dedicated communication link or through one or more serial data interconnects.

The processing circuit 102 may provide one or more buses 118a, 118b, 120 that enable certain devices 104, 106, and/or 108 to communicate. In one example, the ASIC 104 may include a bus interface circuit 116 that includes a combination of circuits, counters, timers, control logic and other configurable circuits or modules. In one example, the bus interface circuit 116 may be configured to operate in accordance with communication specifications or protocols. The processing circuit 102 may include or control a power management function that configures and manages the operation of the apparatus 100.

Figure 2:
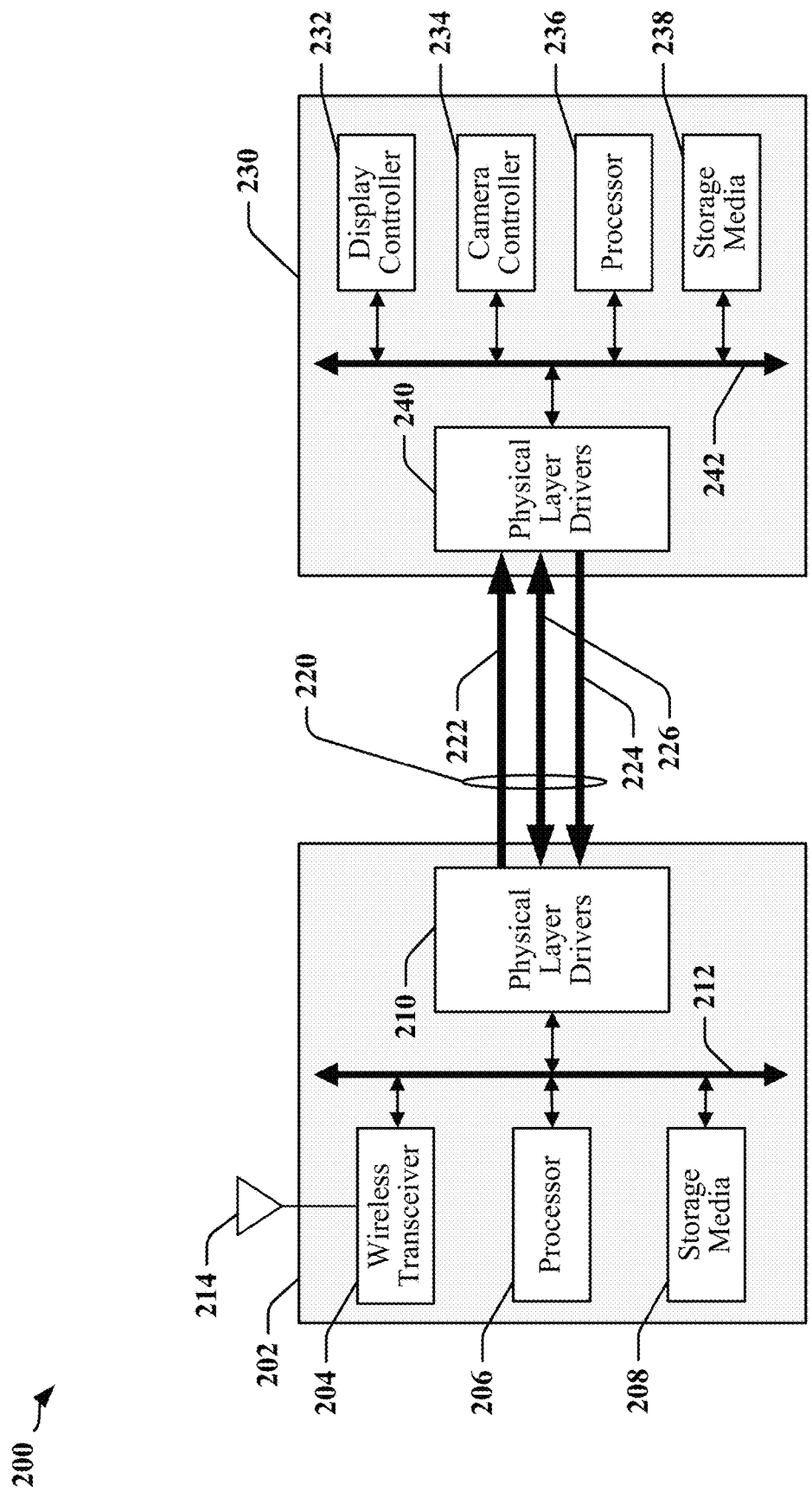
FIG. 2 illustrates a system architecture for an apparatus employing a data link between IC devices that selectively operates according to one of a plurality of available standards.

FIG. 2 illustrates certain aspects of an apparatus 200 that includes IC devices 202 and 230 that can exchange data and control information through a communication link 220. The communication link 220 may be used to connect a pair of IC devices 202 and 230 that are located in close proximity to one another, or that are physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channel 226 may be bidirectional, and may operate in half-duplex and/or full-duplex modes. One or more channel 222 and 224 may be unidirectional. The communication link 220 may be asymmetrical, providing higher bandwidth in one direction. In one example described herein, a first channel 222 may be referred to as a forward channel 222 while a second channel 224 may be referred to as a reverse channel 224. The first IC device 202 may be designated as a host system or transmitter, while the second IC device 230 may be designated as a client system or receiver, even if both IC devices 202 and 230 are configured to transmit and receive on the channel 222. In one example, the forward channel 222 may operate at a higher data rate when communicating data from a first IC device 202 to a second IC device 230, while the reverse channel 224 may operate at a lower data rate when communicating data from the second IC device 230 to the first IC device 202.

Each of the IC devices 202 and 230 may each include a processor 206, 236 or other processing circuit, computing circuit or device. In one example, the first IC device 202 may perform core functions of the apparatus 200, including establishing and maintaining wireless communication through a wireless transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard controller, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more internal bus 212 and 242 and/or a channel 222, 224 and/or 226 of the communication link 220.

The reverse channel 224 may be operated in the same manner as the forward channel 222. The forward channel 222 and the reverse channel 224 may be capable of transmitting at comparable speeds or at different speeds, where speed may be expressed as data transfer rate and/or clocking rates. The forward and reverse data rates may be substantially the same or may differ by orders of magnitude, depending on the application. In some applications, a single bidirectional channel 226 may support communication between the first IC device 202 and the second IC device 230. The forward channel 222 and/or the reverse channel 224 may be configurable to operate in a bidirectional mode when, for example, the forward and reverse channels 222 and 224 share the same physical connections and operate in a half-duplex manner. In one example, the communication link 220 may be operated to communicate control, command and other information between the first IC device 202 and the second IC device 230 in accordance with an industry or other standard.

The communication link 220 of FIG. 2 may be implemented according to MIPI Alliance specifications for C-PHY and may provide a wired bus that includes a plurality of signal wires, where the number of the signal wires may be denoted as M wires. The M wires may be configured to carry N-phase encoded data in a high-speed digital interface, such as a mobile display digital interface (MDDI). The M wires may facilitate N-phase polarity encoding on one or more of the channels 222, 224 and 226. The physical layer drivers 210 and 240 may be configured or adapted to generate N-phase polarity encoded data for transmission on the communication link 220. The use of N-phase polarity encoding provides high speed data transfer and may consume half or less of the power of other interfaces because fewer drivers are active in N-phase polarity encoded data links.

The physical layer drivers 210 and 240 can typically encode multiple bits per transition on the communication link 220 when configured for N-phase polarity encoding. In one example, 3-phase, polarity encoding may be used to support a wide video graphics array (WVGA) 80 frames per second LCD driver IC without a frame buffer, delivering pixel data at 810 Mbps for display refresh.

Figure 3:
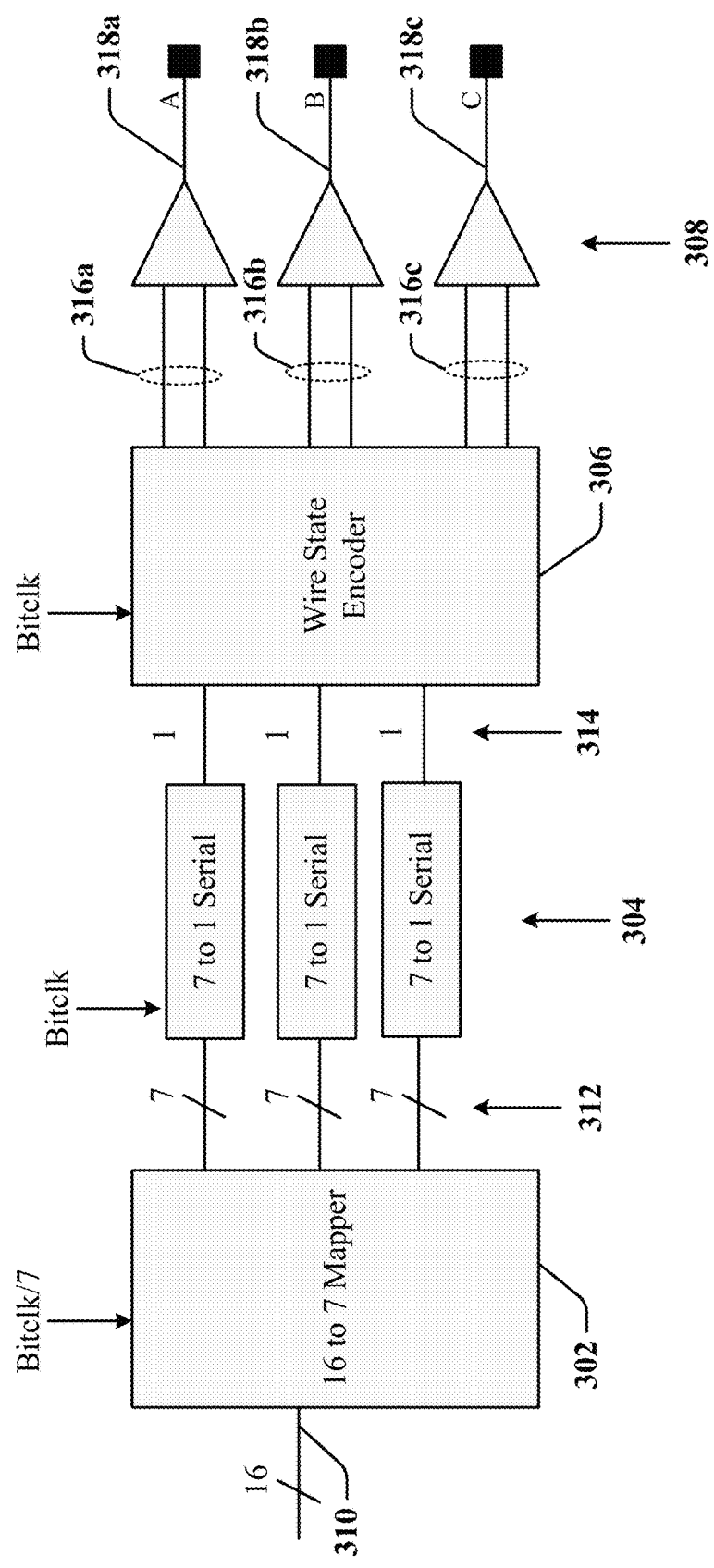
FIG. 3 illustrates a C-PHY 3-phase transmitter.

FIG. 3 illustrates a C-PHY transmitter 300 that may be used to implement certain aspects of the communication link 220 depicted in FIG. 2. For the purposes of this description, the C-PHY transmitter 300 may be assumed to support 3-wire, 3-phase encoding. The example of 3-wire, 3-phase encoding is selected solely for the purpose of simplifying descriptions of certain aspects of the invention. The principles and techniques disclosed for 3-wire, 3-phase encoding may be applicable to other configurations of M-wire, N-phase polarity encoding.

Signaling states defined for each of the 3 wires in a 3-wire, 3-phase polarity encoding serial bus may include an undriven or mid-level state, a positively driven state and a negatively driven state. The positively driven state and the negatively driven state may be obtained by providing a voltage differential between two of the signal wires 318a, 318b and/or 318c, and/or by driving a current through two of the signal wires 318a, 318b and/or 318c connected in series such that the current flows in different directions in the two signal wires 318a, 318b and/or 318c. The undriven state may be realized by placing an output of a driver of a signal wire 318a, 318b or 318c in a high-impedance mode. In some instances, a mid-level state may be obtained on a signal wire 318a, 318b or 318c by passively or actively causing a signal wire 318a, 318b or 318c to attain a voltage level that lies substantially halfway between positive and negative voltage levels provided on driven signal wires 318a, 318b and/or 318c. Typically, there is no significant current flow through an undriven or mid-level signal wire 318a, 318b or 318c. Signaling states defined for a 3-wire, 3-phase polarity encoding scheme may be denoted using the three voltage or current states (+1, −1, and 0).

A C-PHY transmitter 300 may employ line drivers 308 to control the signaling state of signal wires 318a, 318b and 318c. The line drivers 308 may be implemented as unit-level current-mode or voltage-mode drivers. In one example, each line driver 308 may receive sets of two or more of signals 316a, 316b and 316c that determine the output state of corresponding signal wires 318a, 318b and 318c. In one example, the sets of two signals 316a, 316b and 316c may include a pull-up signal (PU signal) and a pull-down signal (PD signal) that, when high, activate pull-up and pull-down circuits that drive the signal wires 318a, 318b and 318c toward a higher level or lower level voltage, respectively. In this example, when both the PU signal and the PD signal are low, the signal wires 318a, 318b and 318c may be terminated to a mid-level voltage.

For each transmitted symbol interval in an M-wire, N-phase polarity encoding scheme, at least one signal wire 318a, 318b or 318c is in the midlevel/undriven (0) voltage or current state, while the number of positively driven (+1 voltage or current state) signal wires 318a, 318b or 318c is equal to the number of negatively driven (−1 voltage or current state) signal wires 318a, 318b or 318c, such that the sum of current flowing to the receiver is always zero. For each symbol, the signaling state of at least one signal wire 318a, 318b or 318c is changed from the wire state transmitted in the preceding transmission interval.

In operation, a mapper 302 may receive and map 16-bit data 310 to 7 symbols 312. In the 3-wire example, each of the 7 symbols 312 defines the states of the signal wires 318a, 318b and 318c for one symbol interval. The 7 symbols 312 may be serialized using parallel-to-serial converters 304 that provide a timed sequence of symbols 314 for each signal wire 318a, 318b and 318c. The sequence of symbols 314 is typically timed using a transmission clock. A 3-wire, 3-phase encoder 306 receives the sequence of 7 symbols 314 produced by the mapper one symbol at a time and computes the state of each signal wire 318a, 318b and 318c for each symbol interval. The 3-wire, 3-phase encoder 306 selects the states of the signal wires 318a, 318b and 318c based on the current input symbol 314 and the previous states of signal wires 318a, 318b and 318c.

The use of M-wire, N-phase encoding permits a number of bits to be encoded in a plurality of symbols where the bits per symbol is not an integer. In the example of a 3-wire communication link, there are 3 available combinations of 2 wires, which may be driven simultaneously, and 2 possible combinations of polarity on the pair of wires that is driven, yielding 6 possible states. Since each transition occurs from a current state, 5 of the 6 states are available at every transition. The state of at least one wire is required to change at each transition. With 5 states, $\log_2(5) \cong 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encode five states has $5^7$ (78,125) permutations. Accordingly, the 7 symbols may be used to encode the $2^{16}$ (65,536) permutations of 16 bits.

Figure 4:
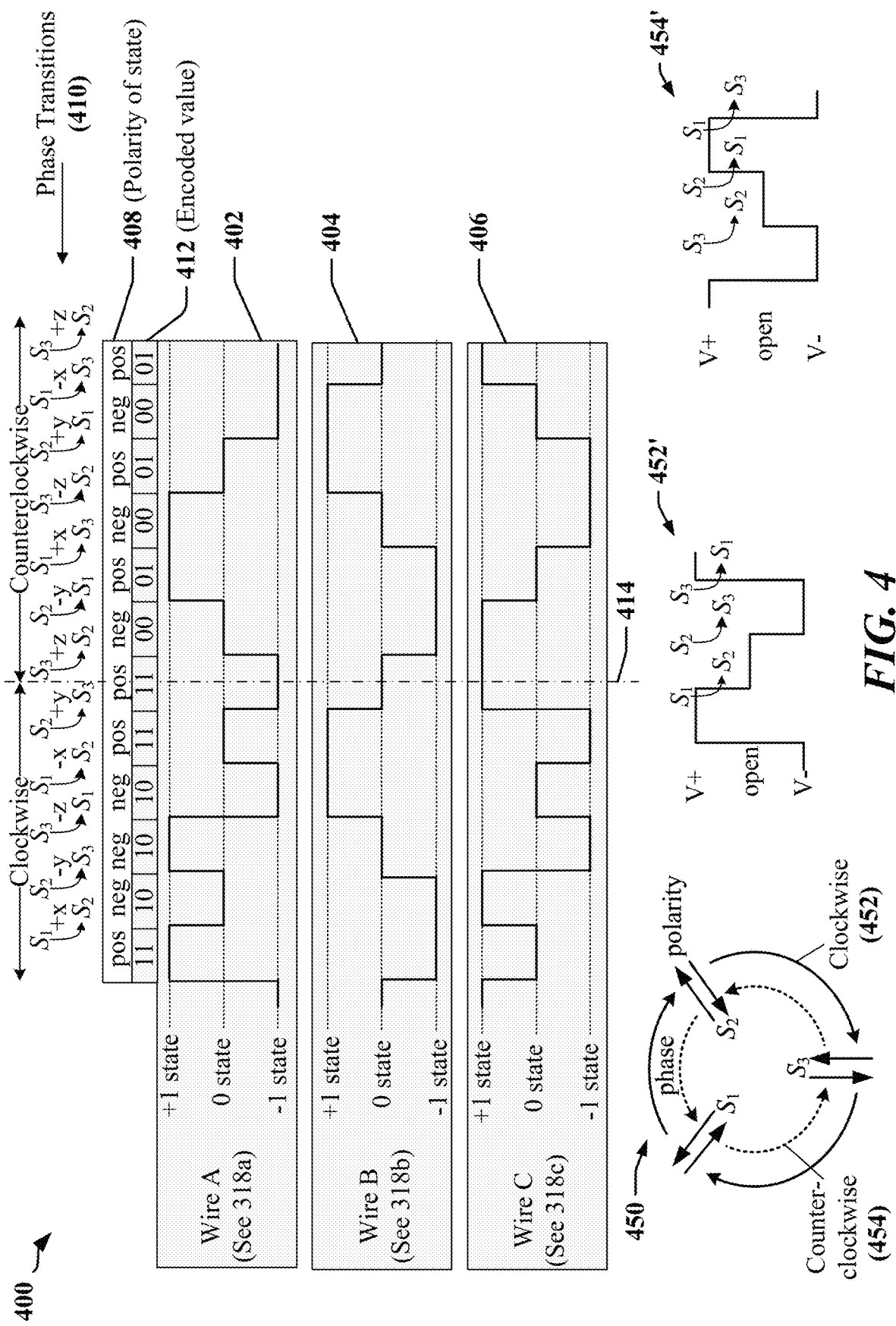
FIG. 4 illustrates signaling in a C-PHY 3-phase encoded interface.

FIG. 4 includes an example of a timing diagram 400 for signals encoded using a three-phase modulation data-encoding scheme, which is based on the circular state diagram 450. Information may be encoded in a sequence of signaling states where, for example, a wire or connector is in one of three phase states $S_1$, $S_2$ and $S_3$ defined by the circular state diagram 450. Each state may be separated from the other states by a 120° phase shift. In one example, data may be encoded in the direction of rotation of phase states on the wire or connector. The phase states in a signal may rotate in clockwise direction 452 and 452' or counterclockwise direction 454 and 454'. In the clockwise direction 452 and 452' for example, the phase states may advance in a sequence that includes one or more of the transitions from $S_1$ to $S_2$, from $S_2$ to $S_3$ and from $S_3$ to $S_1$. In the counterclockwise direction 454 and 454', the phase states may advance in a sequence that includes one or more of the transitions from $S_1$ to $S_3$, from $S_3$ to $S_2$ and from $S_2$ to $S_1$. The three signal wires 318a, 318b and 318c carry different versions of the same signal, where the versions may be phase shifted by 120° with respect to one another. Each signaling state may be represented as a different voltage level on a wire or connector and/or a direction of current flow through the wire or connector. During each of the sequence of signaling states in a 3-wire system, each signal wire 318a, 318b and 318c is in a different signaling state than the other wires. When more than 3 signal wires 318a, 318b and 318c are used in a 3-phase encoding system, two or more signal wires 318a, 318b and/or 318c can be in the same signaling state at each signaling interval, although each state is present on at least one signal wire 318a, 318b and/or 318c in every signaling interval.

Information may be encoded in the direction of rotation at each phase transition 410, and the 3-phase signal may change direction for each signaling state. Direction of rotation may be determined by considering which signal wires 318a, 318b and/or 318c are in the '0' state before and after a phase transition, because the undriven signal wire 318a, 318b and/or 318c changes at every signaling state in a rotating three-phase signal, regardless of the direction of rotation.

The encoding scheme may also encode information in the polarity 408 of the two signal wires 318a, 318b and/or 318c that are actively driven. At any time in a 3-wire implementation, exactly two of the signal wires 318a, 318b, 318c are driven with currents in opposite directions and/or with a voltage differential. In one implementation, data may be encoded using two-bit values 412, where one bit is encoded in the direction of phase transitions 410 and the second bit is encoded in the polarity 408 for the current state.

The timing diagram 400 illustrates an example of data encoding using both phase rotation direction and polarity. The curves 402, 404 and 406 relate to signals carried on three signal wires 318a, 318b and 318c, respectively for multiple phase states. Initially, the phase transitions 410 are in a clockwise direction and the most significant bit is set to binary '1,' until the rotation of phase transitions 410 switches at a time 414 to a counterclockwise direction, as represented by a binary '0' of the most significant bit. The least significant bit reflects the polarity 408 of the signal in each state.

According to certain aspects disclosed herein, one bit of data may be encoded in the rotation, or phase change in a 3-wire, 3-phase encoding system, and an additional bit may be encoded in the polarity of the two driven wires. Additional information may be encoded in each transition of a 3-wire, 3-phase encoding system by allowing transition to any of the possible states from a current state. Given 3 rotational phases and two polarities for each phase, 6 states are available in a 3-wire, 3-phase encoding system. Accordingly, 5 states are available from any current state, and there may be $\log_2(5)$ 2.32 bits encoded per symbol (transition), which allows the mapper 302 to accept a 16-bit word and encode it in 7 symbols.

Figure 5:
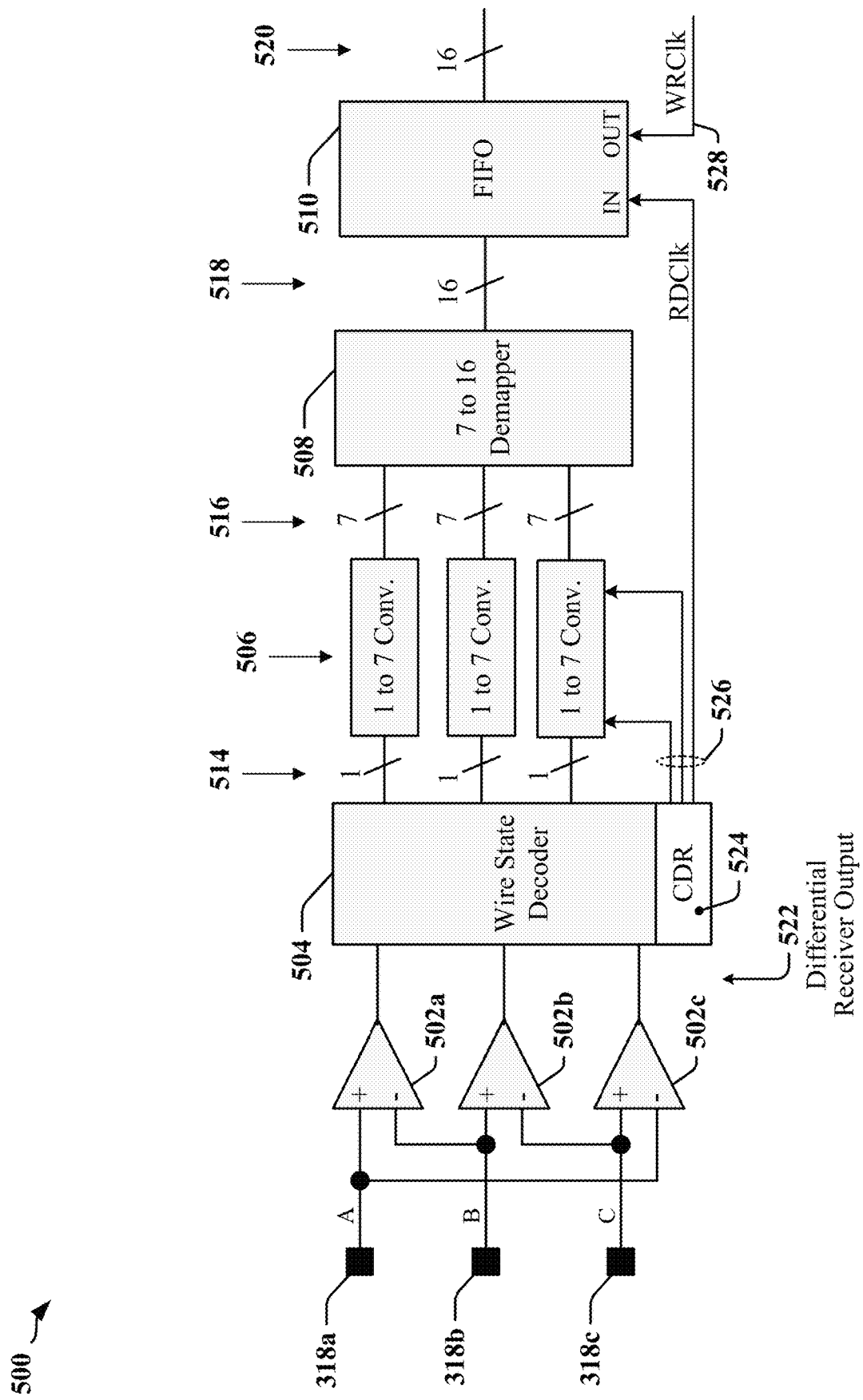
FIG. 5 illustrates a C-PHY 3-phase receiver.

FIG. 5 illustrates certain aspects of a C-PHY receiver 500. For the purposes of this description, the C-PHY receiver 500 may be assumed to support 3-wire, 3-phase decoding. Differential receivers 502a, 502b, 502c and a wire state decoder 504 are configured to provide a digital representation of the state of the three transmission lines (e.g., the signal wires 318a, 318b and 318c illustrated in FIG. 3), with respect to one another, and to detect changes in the state of the three transmission lines compared to the state transmitted in the previous symbol period. Seven consecutive states are assembled by the serial-to-parallel convertors 506 to obtain a set of 7 symbols 516 to be processed by the demapper 508. The demapper 508 produces 16 bits of data 518 that may be buffered in a first-in-first-out register (FIFO 510) that provides an output 520 of the C-PHY receiver 500.

The wire state decoder 504 may extract a sequence of symbols 514 from difference signals 522 derived from phase encoded signals received by the differential receivers 502a, 502b, 502c from the signal wires 318a, 318b and 318c. The symbols 514 are encoded as a combination of phase rotation and polarity as disclosed herein. The wire state decoder may include a CDR circuit 524 that extracts timing information from transitions on the signal wires 318a, 318b and 318c and, from the timing information, generates clock signals 526 that can be used to reliably capture wire states from the signal wires 318a, 318b and 318c. A transition occurs on least one of the signal wires 318a, 318b and 318c at each symbol boundary and the CDR circuit 524 may be configured to generate the clock signals 526 based on the occurrence of a transition or multiple transitions. Edges in one or more of the clock signals 526 may be delayed to allow time for all signal wires 318a, 318b and 318c to have stabilized and to thereby ensure that the current wire state is captured for decoding purposes. In one example, the one or more of the clock signals 526 may include a RDClk signal used to cause the FIFO 510 to read or capture data output by the demapper 508. In some examples, other clock signals may be used by the C-PHY receiver 500. For example, a write clock signal 528 (WRClk) may be received from a processing circuit to enable the FIFO 510 to asynchronously write out its contents to external processing devices or storage devices.

Figure 6:
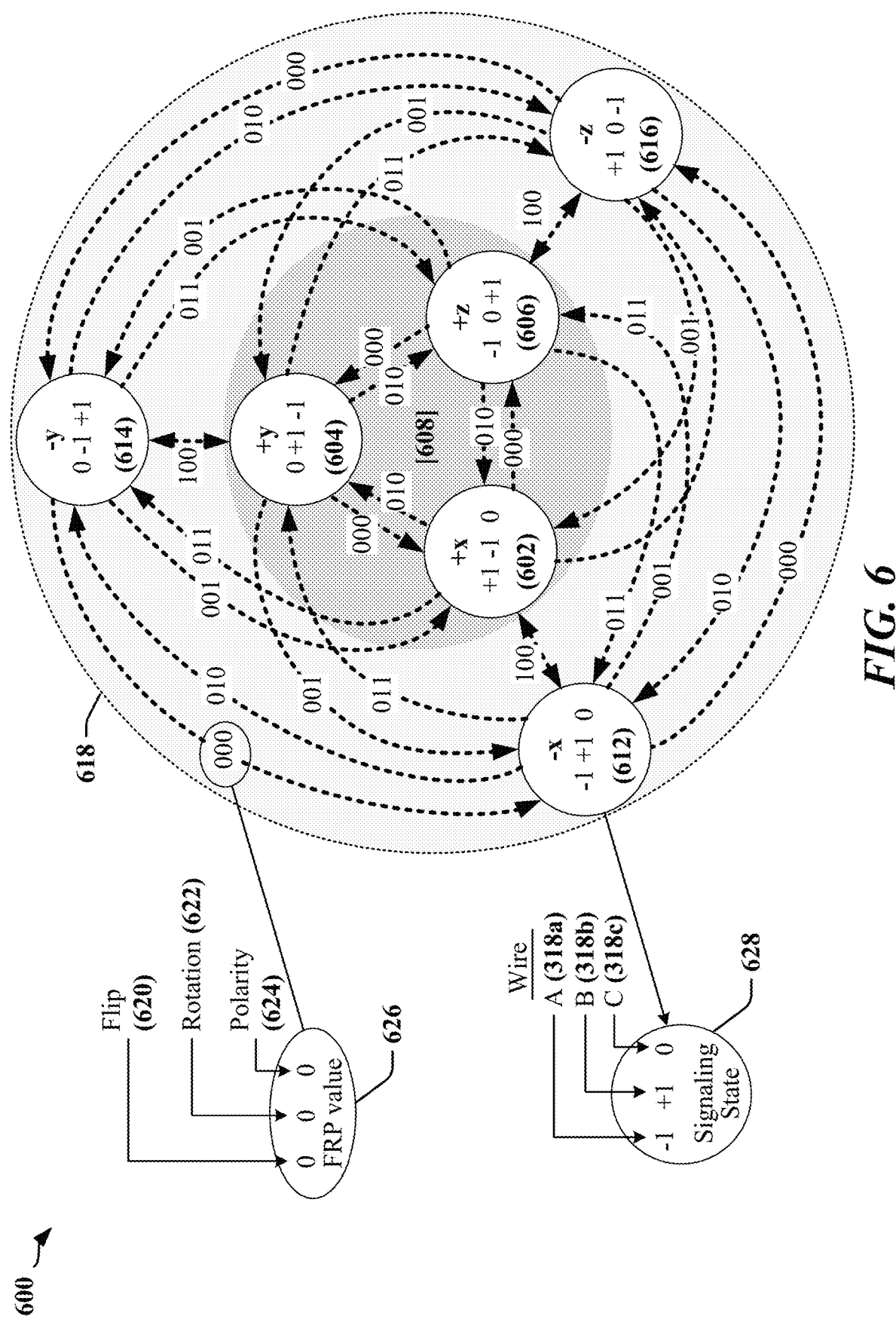
FIG. 6 is a state diagram illustrating potential state transitions in a C-PHY 3-phase encoded interface.

FIG. 6 is state diagram 600 illustrating the possible signaling states 602, 604, 606, 612, 614, 616 of the three wires of a C-PHY bus, with the possible transitions illustrated from each state. In the example of a C-PHY interface configured for 3-wire, 3-phase encoding, 6 states and 30 state transitions are available. The possible signaling states 602, 604, 606, 612, 614 and 616 in the state diagram 600 include and expand on the states shown in the circular state diagram 450 of FIG. 4. As shown in the exemplar of a state element 628, each signaling state 602, 604, 606, 612, 614 and 616 in the state diagram 600 defines voltage signaling state for the signal wires 318a, 318b, 318c in each state, which are labeled A, B and C respectively. For example, in signaling state 602 (+x) wire A=+1, wire B=−1 and wire C=0, yielding output of differential receiver 502a (A−B)=+2, differential receiver 502b (B−C)=−1 and differential receiver 502c (C−A)=−1. Transition decisions taken by phase change detect circuits in a receiver are based on 5 possible levels produced by the differential receivers 502a, 502b, 502c, which include −2, −1, 0, +1 and +2 voltage states.

The transitions in the state diagram 600 can be represented by a Flip, Rotate, Polarity symbol (e.g., the FRP symbol 626) that has one of the three-bit binary values in the set: {000, 001, 010, 011, 100}. The Rotation bit 622 of the FRP symbol 626 indicates the direction of phase rotation associated with a transition to a next state. The Polarity bit 624 of the FRP symbol 626 is set to binary 1 when a transition to a next state involves a change in polarity. When the Flip bit 620 of the FRP symbol 626 is set to binary 1, the Rotate and Polarity values may be ignored and/or zeroed. A flip represents a state transition that involves only a change in polarity. Accordingly, the phase of a 3-phase signal is not considered to be rotating when a flip occurs and the polarity bit is redundant when a flip occurs. The FRP symbol 626 corresponds to wire state changes for each transition. The state diagram 600 may be separated into an inner circle 608 that includes the positive polarity signaling states 602, 604, 606 and an outer circle 618 that encompasses the negative polarity signaling states 612, 614, 616.

Figure 7:
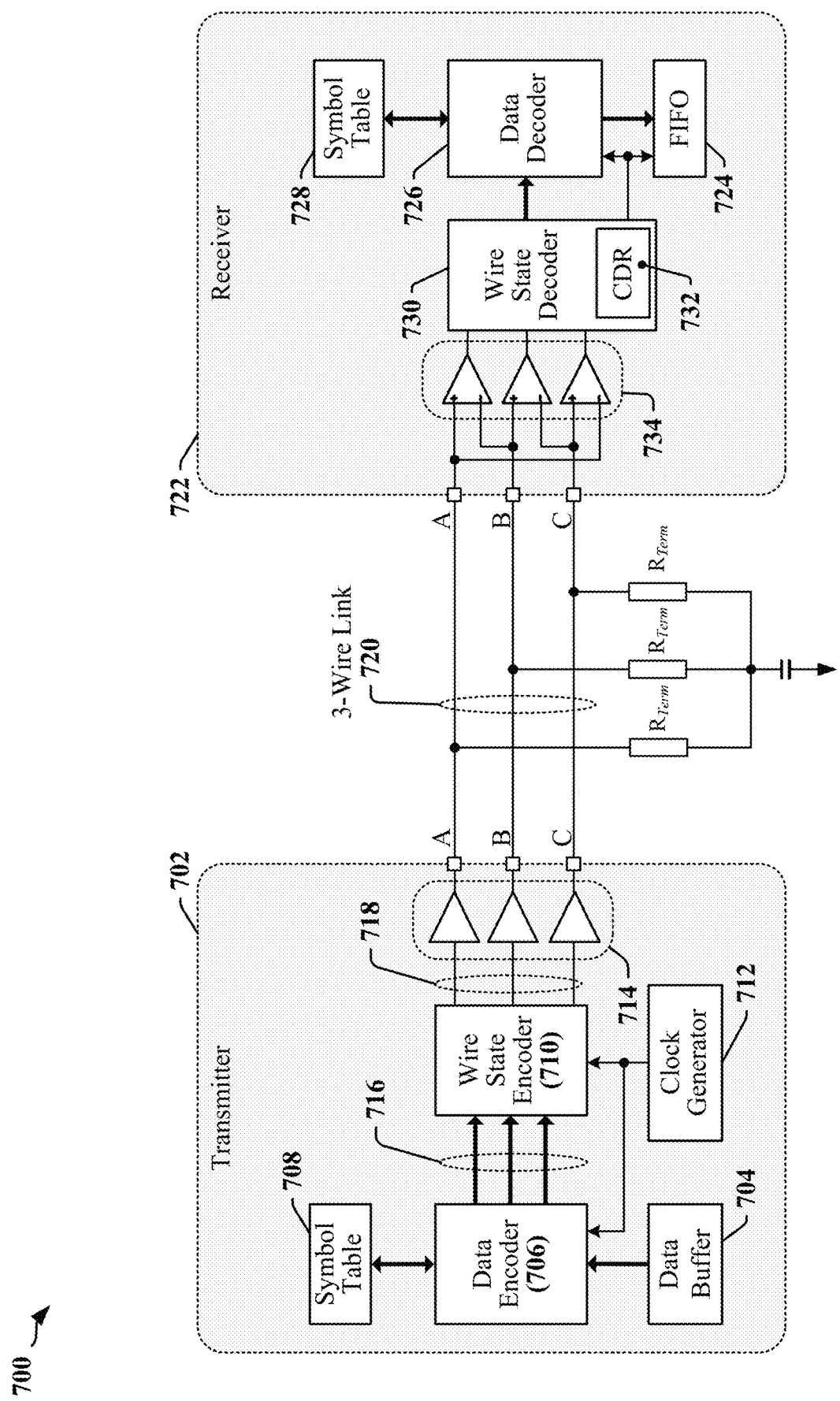
FIG. 7 illustrates a C-PHY interface circuit that may be adapted in accordance with certain aspects disclosed herein.

FIG. 7 illustrates an example of a system 700 that has been adapted in accordance with certain aspects of this disclosure to support various encoding schemes that include 3-phase encoding. A transmitter 702 is coupled to a receiver 722 by a 3-wire link 720. The transmitter 702 includes a data buffer 704 that receives and holds data to be communicated to the receiver 722. The data may be received by the data buffer 704 from an application processor, peripheral, sensor, storage device, imaging device, display, or another source of data. In some examples, the data is stored as 8-bit bytes, 16-bit, 32-bit or 64-bit words, or words of another size. In some examples, each unit of data is stored with parity bits, and/or error-checking bits; for example, a parity bit may be provided for each byte, and/or parity bits or cyclic redundancy bits may be calculated for a block of data bytes or words and transmitted as additional bytes or words. In some instances, the data may be encapsulated with control information in packets or other data structures generated in accordance with one or more layers of a communication protocol. The data buffer 704 may be provided to a data encoder 706 in a size defined by the application. The data encoder 706 may include components configured to reformat data received from the data buffer 704, map the reformatted data to one or more symbols, and serialize or otherwise sequence the symbols for transmission in accordance with a transmission clock.

In certain implementations, the data encoder 706 receives data from the data buffer 704 in units that are sized according to the encoding rate associated with the encoding scheme. In some examples, the data encoder 706 is configured to process data in 8-bit bytes, 16-bit words or 32-bit words. In some examples, the data encoder 706 may include circuits that reorganize data supplied by the data buffer 704 to a set of 8-bit bytes or 16-bit words such that the unit size of data is constant regardless of the encoding scheme configured for the data encoder 706. In one example, the data encoder 706 generates three multibit codes 716 representing the signaling state of each wire of the 3-wire link 720 during each symbol transmission interval. The data encoder 706 provides the three multibit codes 716 to the wire state encoder 710. The wire state encoder 710 generates control signals 718 that are provided to the line drivers 714. Each of the line drivers 714 receives one or more of the control signals 718, which it uses to define the signaling state of a corresponding wire of the 3-wire link 720.

In certain implementations, each of the three multibit codes 716 causes the wire state encoder 710 to generate a set of control signals 718 that configure switches in the line drivers 714, where the state of the switches (e.g., closed or open) may select current or voltage levels to be provided to the wires of the 3-wire link 720. The state of the control signals 718 generated by the wire state encoder 710 responsive to the three multibit codes 716 may be configured based on the active encoding scheme or on the type of line driving circuit used to implement the line drivers 714. Different types of line driving circuits may have different numbers of switches to be controlled to select a desired signaling state. Operations of the data encoder 706 and wire state encoder 710 may be performed in accordance with timing information indicated in a clock signal provided by a clock generator circuit.

The data encoder 706 operates to cause a stream of symbols to be transmitted on the 3-wire link 720, where each symbol is transmitted as a combination of signaling states of the 3 wires of the 3-wire link 720. The data encoder 706 may be configured for one or more modes of operation and for one or more encoding schemes.

In a first example, the transmitter 702 may be actively transmitting a stream of symbols over the 3-wire link 720, where the data encoder 706 has generated an $N^{th}$ symbol ($S_N$) and has added $S_N$ to the stream of symbols. The data encoder 706 may be configured for a first mode of operation in which each unit of data is encoded independently. In this first mode, the data encoder 706 uses the next unit of data to be encoded to select a next symbol for transmission. In one example, the data encoder 706 may generate an index used to select a next symbol ($S_{N+1}$), where the index to $S_{N+1}$ is generated using the next four bits as an offset from the index to $S_N$. The index is generated in a manner that prevents the selection of the same symbol as $S_N$ and $S_{N+1}$. In one example, the index to $S_{N+1}$ may be calculated by addition or subtraction of the next four bits to the index to $S_N$. In another example, the index to $S_{N+1}$ may be calculated using an algorithm that receives the next four bits and the index to $S_N$ as variables.

In a second example, the transmitter 702 may be actively transmitting a stream of symbols over the 3-wire link 720, where the data encoder 706 has generated an $N^h$ symbol ($S_N$) and has added $S_N$ to the stream of symbols. The data encoder 706 may be configured for a second mode of operation in which one or more bytes of data are encoded in a sequence of symbols $\{S_{N+1}, S_{N+2}, \ldots\}$. In one example, the data encoder 706 uses the value of $S_N$ and one or more data bytes to index a table that maintains sequences of symbols. In another example, the data encoder 706 uses the one or more data bytes to index a table that maintains sets of offsets used to select a sequence of symbols based on the value of $S_N$. The data encoder 706 produces the sequence of symbols by using the combined offsets to generate an index to a next symbol from the index used to generate the previously generated symbol. For example, the data encoder 706 may generate an index to the symbol table 708 for selecting $S_{N+1}$ based on the value of the first offset in the set of offsets and the index used to select $S_N$. In some instances, the set of offsets may be obtained by indexing a table using the content of the one or more bytes as an index. In some instances, the set of offsets may be generated by breaking the units of data into one or more bytes or words.

In some implementations, the data encoder 706 may include or be coupled to parallel-to-serial convertors that convert symbols expressed as a block of multibit codes representative of the signaling states of the 3-wire link 720 into a time-ordered sequence of symbols. A sequence of symbols $\{S_1, S_2, \ldots S_N, S_{N+1}, \ldots\}$ may be transmitted in corresponding symbol transmission intervals $\{t_1, t_2, \ldots t_N, t_{N+1}, \ldots\}$, where the symbol transmission intervals are defined based on a clock signal provided by the clock generator 712. The sequence of multibit codes 716 provided to the wire state encoder 710 include an Nth symbol ($S_N$) that is used to generate signaling state of the 3-wire link 720 during a corresponding Nth symbol transmission interval ($t_N$) symbol, followed by an (N+1)th symbol ($S_{N+1}$) that is used to generate signaling state of the 3-wire link 720 during a corresponding (N+1)th symbol transmission interval ($t_{N+1}$).

The receiver 722 includes differential receivers 734 that receive signals from the 3-wire link 720. The differential receivers 734 may be operable to discriminate between the N signaling states defined in an encoding scheme in accordance with certain aspects disclosed herein. The differential receivers 734 provide differential output signals to a wire state decoder 730 that is configured to extract a symbol from the differential output signals. The symbol is then provided to a data decoder 726 that may be configured to operate on individual symbols or on groups of symbols. The data decoder 726 may include components configured to deserialize received symbols and demap one or more symbols to obtain decoded data. The data decoder 726 may include components configured to reassemble and reformat the decoded data.

In one mode operation, the data decoder 726 may use a difference between received symbol ($S_{N+1}$) and a preceding symbol ($S_N$) to index a symbol table 728 to obtain 4 bits of decoded data. In another mode operation, the data decoder 726 may use a received sequence of symbols and a preceding symbol ($S_N$) to index the symbol table 728 to obtain multiple bits of decoded data. Decoded data may be provided to a first-in, first-out register (FIFO 724) or another buffer.

The wire state decoder 730 may include a clock and data recovery circuit (CDR 732) that detects transitions in signaling state on one or more wires of the 3-wire link 720 and generates a clock signal based on the timing of the transition. The clock signal may provide timing information used by the data decoder 726, FIFO 724 and other components of the receiver 722.

In a CSI interface defined by the MIPI Alliance and operated in accordance with C-PHY specifications a common mode voltage ranging from 95 mV to 390 mV is defined for the receiver. The C-PHY specifications provide a peak-to-peak voltage ($V_{pp}$) at the receiver that can range between 80 mV to 290 mV in order to account for shifts in ground voltage, termination mismatches and variations associated with sensor usage. Wide common mode direct current (DC) voltage shifts can result in incorrect detection and decoding of received signals. In some other serial interfaces, including interfaces based on a serializer/deserializer (SERDES), DC shifts may be mitigated through the use of alternating current (AC) coupling. Data patterns in transmission according to C-PHY protocols can include long 0's and 1's, which can cause drift in DC levels (DC wander), and that can prevent the use of AC coupling to adjust for receiver bias resulting from DC shift. In some conventional systems, the wide common mode voltage range may be accommodated through the use of level shifting. In a C-PHY interface, many level-shifting stages would be required to accommodate the wide common mode voltage range and a supply voltage of 1.2V may be required to provide a highly linear receiver that can handle a wide common mode voltage range. The resultant receiver would be expected to consume significant additional power and occupy greater space on IC.

Figure 8:
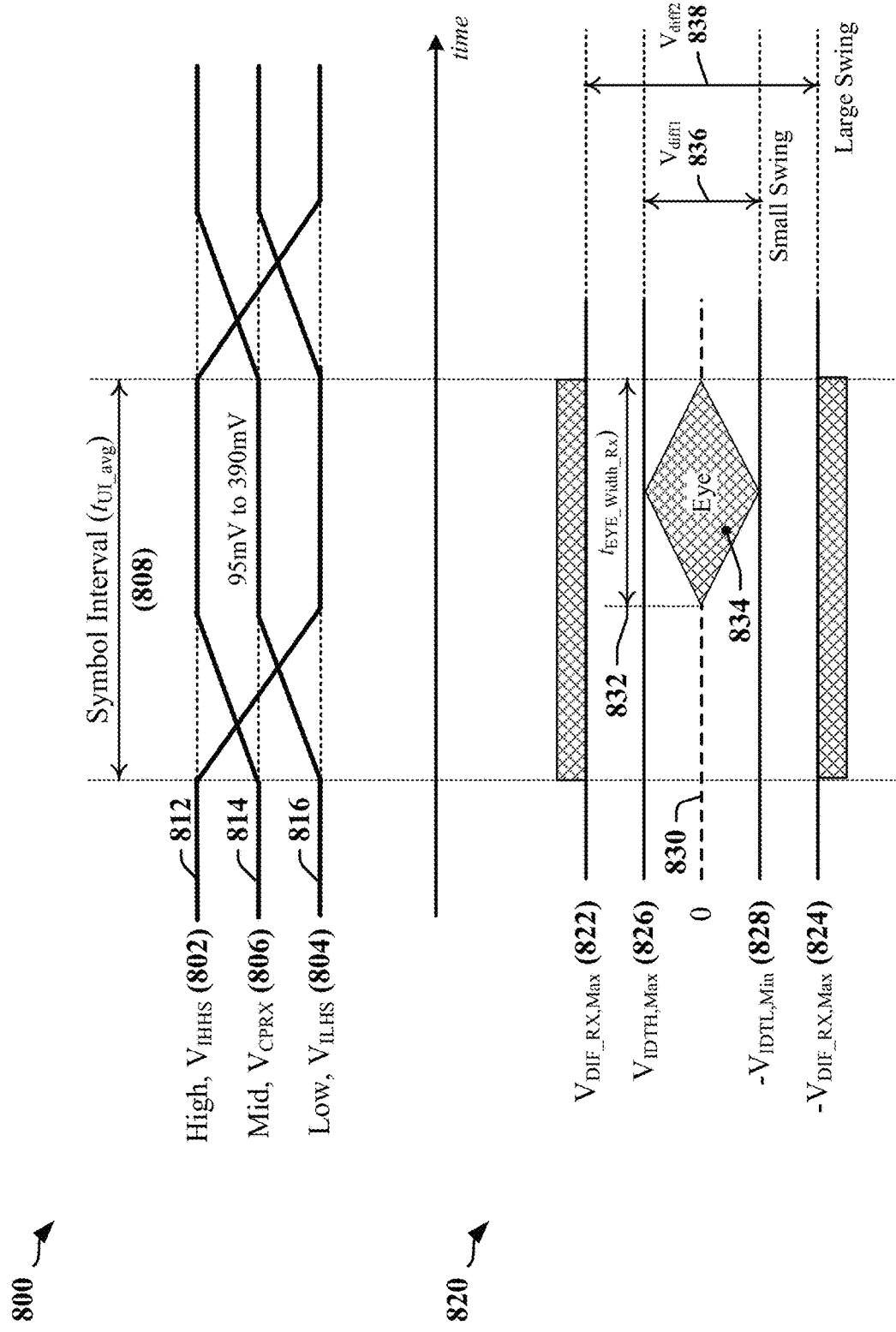
FIG. 8 illustrates the effect of common mode voltage variations in a C-PHY interface.

FIG. 8 illustrates the effect of common mode voltage variations in an example of a C-PHY interface. The timing diagram shows three signals 812, 814, 816 transitioning between three defined signaling states 802, 804, 806. The high signaling state 802 for high-speed operation has a voltage level identified as $V_{IHHS}$, the low signaling state 804 for high-speed operation has a voltage level identified as $V_{ILHS}$, and the mid-level or common mode signaling state 806 for high-speed operation has a voltage level identified as $V_{CPRX}$. In C-PHY specifications for CSI, the common mode voltage for a receiver defined for receiver ranges from 95 mV<$V_{CPRX}$<390 mV to account for any common mode voltage range shifting, termination mismatch or sensor variations. The eye diagram 820 shows an eye 834 that corresponds to the voltage and time zone in which the three signals 812, 814, 816 can be reliably sampled under all expected operating conditions. The eye 834 has a width 832 and a variable voltage range in which the three signals 812, 814, 816 can be sampled. The eye diagram 820 also shows the possible output states of differential receivers 734 (see FIG. 7). A maximum positive difference state 822 has a largest voltage level identified as $V_{DIF\_RX\_Max}$, a maximum negative difference state 824 has a largest voltage level identified as $-V_{DIF\_RX\_Max}$, an intermediate positive difference state 826 has a largest voltage level identified as $V_{IDTH\_Max}$, an intermediate negative difference state 828 has a largest voltage level identified as $-V_{IDTH\_Max}$. The amplitude of the largest expected voltage swing at the beginning of a symbol interval 808 is and $2V_{DIF\_RX\_Max}$ and the amplitude of the smallest expected voltage swing at the beginning of a symbol interval 808 is and $2V_{IDTH\_Max}$.

Table 1, below, illustrates certain examples of voltages and differential voltage swings ($V_{diff1}$ 836 and $V_{diff2}$ 838) for different values of $V_{CPRX}$.

TABLE 1

|  | Example 1<br>Large Swing,<br>Low $V_{CPRX}$ | Example 2<br>Small Swing,<br>Low $V_{CPRX}$ | Example 3<br>Large Swing,<br>High $V_{CPRX}$ | Example 4<br>Small Swing,<br>High $V_{CPRX}$ |
|---|---|---|---|---|
| $V_{diff}$ Swing | 540 mV | 80 mV | 580 mV | 80 mV |
| $V_{IHHS}$ | ≅230 mV | ≅135 mV | ≅535 mV | ≅430 mV |
| $V_{CPRX}$ | 95 mV | 95 mV | 390 mV | 390 mV |
| $V_{ILHS}$ | ≅−40 mV | ~55 mV | ≅245 mV | ≅350 mV |

In the first example shown in Table 1, a large $V_{diff2}$ 838 of 540 mV is produced when the voltage difference between $V_{IHHS}$ and $V_{CPRX}$ and between $V_{ILHS}$ and $V_{CPRX}$ is 135 mV and when $V_{CPRX}$ is at the minimum 95 mV level. In the second example shown in Table 1, a small $V_{diff1}$ 836 of 80 mV is produced when the voltage difference between $V_{IHHS}$ and $V_{CPRX}$ and between $V_{ILHS}$ and $V_{CPRX}$ is 40 mV and when $V_{CPRX}$ is at the minimum 95 mV level. In the third example shown in Table 1, a large $V_{diff2}$ 838 of 580 mV is produced when the voltage difference between $V_{IHHS}$ and $V_{CPRX}$ and between $V_{ILHS}$ and $V_{CPRX}$ is 145 mV and when $V_{CPRX}$ is at the minimum 390 mV level. In the fourth example shown in Table 1, a small $V_{diff1}$ 836 of 80 mV is produced when the voltage difference between $V_{IHHS}$ and $V_{CPRX}$ and between $V_{ILHS}$ and $V_{CPRX}$ is 40 mV and when $V_{CPRX}$ is at the minimum 390 mV level.

Figure 9:
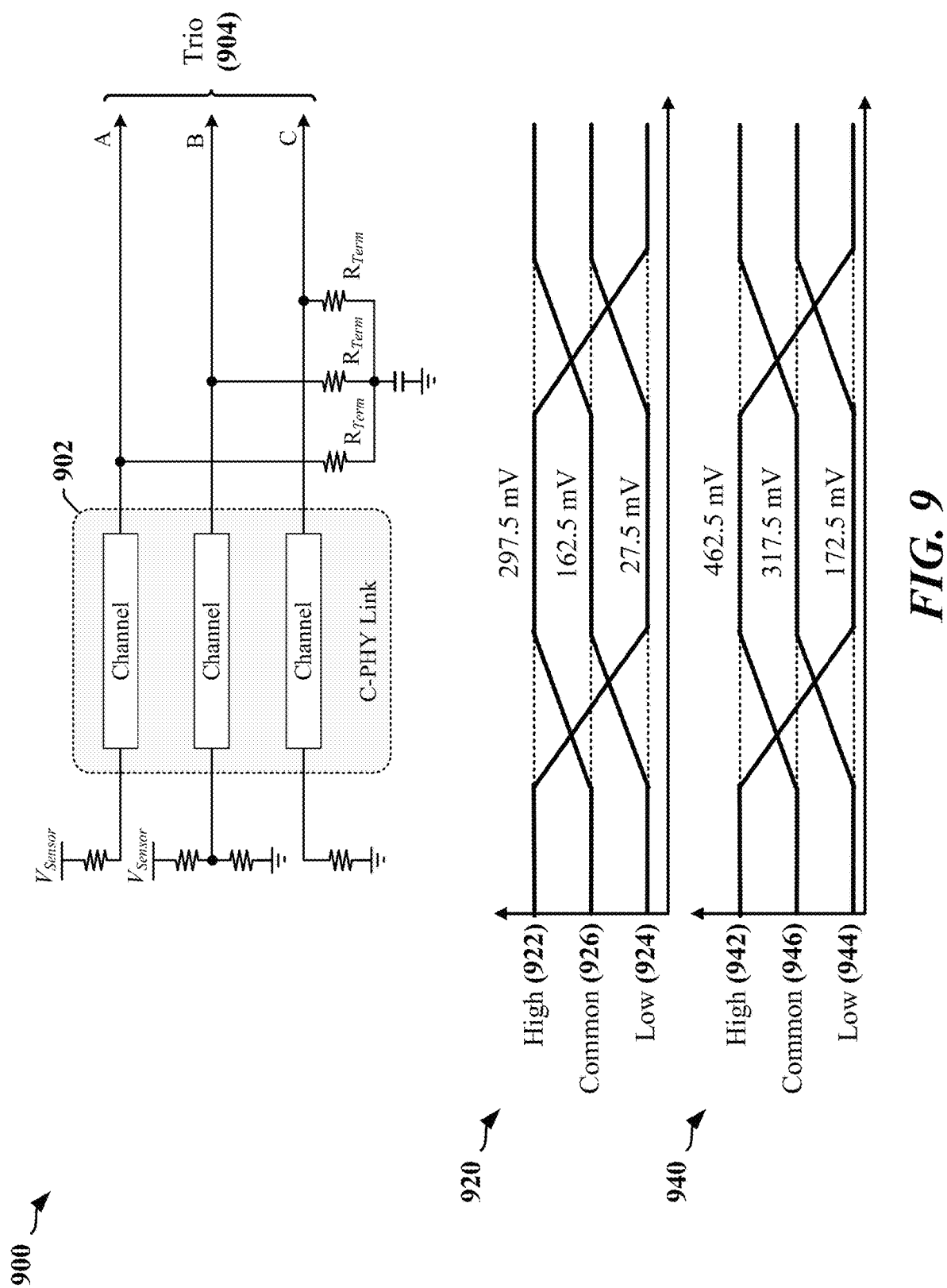
FIG. 9 illustrates variability of signaling states at a receiver coupled to a C-PHY communication link.

FIG. 9 shows two examples 920, 940 illustrating variability of signaling states at a receiver coupled to a C-PHY communication link 900. In the first example, 920, the high signaling state 922 is represented by a voltage level ($V_{Tx\_High}$) of 297.5 mV, the low signaling state 924 is represented by a voltage level ($V_{Tx\_Low}$) of 27.5 mV and the mid-level signaling state corresponding to the common voltage level for the trio 904 is represented by a voltage level ($V_{Rx\_Mid}$) of 162.5 mV. In order to support the signaling in these examples 920, 940, a receiver must be capable of handling a common mode voltage that varies by 155 mV. In conventional systems, the receivers often use level shifting to accommodate the wide common mode requirement of C-PHY interfaces.

The transmitter common mode voltage ($V_{CPTX}$) may be calculated as:

$$V_{CPTX} = (V_{Tx\_High} + V_{Tx\_Low} + V_{Rx\_Mid})/3$$

The transmitter common mode voltage and receiver common mode voltage ($V_{CPRX}$) are generally different. The receiver common mode voltage ($V_{CPRX\_HL}$, $V_{CPRX\_HM}$, $V_{CPRX\_HM}$) may be calculated for each pair of wires in a trio 904 as follows:

$$V_{CPRX\_HL} = (V_{Rx\_High} + V_{Rx\_Low})/2$$

$$V_{CPRX\_HM} = (V_{Rx\_High} + V_{Rx\_Mid})/2,$$

$$V_{CPTX\_LM} = (V_{TR\_Low} + V_{Rx\_Mid})/2.$$

In the examples illustrated in Table 1, the maximum receiver common mode voltage ($V_{CPRX\_Max}$) is 390 mV.

Figure 10:
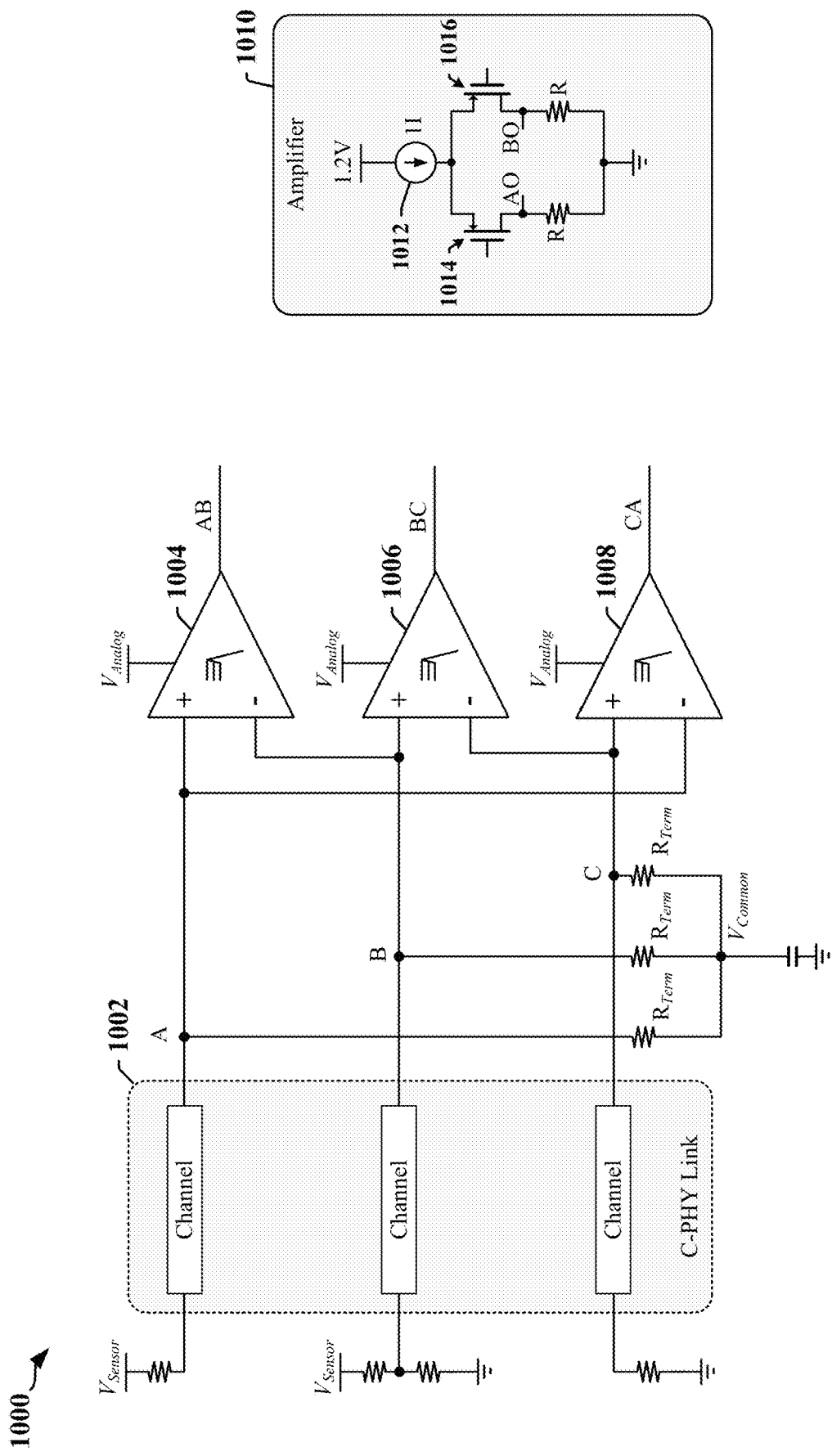
FIG. 10 illustrates certain aspects of a C-PHY interface in which differential receivers are used to couple different pairs of wires in a C-PHY link.

FIG. 10 illustrates certain aspects of a C-PHY interface 1000 in which differential receivers 1004, 1006, 1008 are coupled to different pairs of wires in a C-PHY link 1002. The differential receivers 1004, 1006, 1008 include level-shifting amplifiers 1010 that can be used to accommodate the wide common mode requirement of the C-PHY interface 1000. Each level-shifting amplifier 1010 includes a current source 1012. In one example, the current source 1012 is implemented using a current mirror that is controlled or configured to ensure that the current mirror remains in saturation for all common mode variations. Furthermore, the transistors 1014, 1016 in the level-shifting amplifiers 1010 are thick-oxide devices in order to accommodate the variabilities in received voltage. However, such thick gate based level shifting device can occupy a die area of 780 μm² or more on an IC and may require an operating voltage of 1.2V, with a total current requirement of 9 A for three C-PHY trios. Version 2.0 of the C-PHY specifications support transmission of 8 giga symbols per second (Gsys) for a data rate of 18.5 gigabits per second (Gbps) and, at such signaling rates, the current consumption of a single level shifter operating at 1.2V may be estimated at approximately 1.2 mA and the level shifter can occupy 850 μm² area of an IC.

Certain aspects of this disclosure relate to the use of a common mode servo loop that can automatically accommodate variations in common mode voltage at a receiver coupled to a serial bus operated in accordance with C-PHY specifications and protocols. The servo loop is self-regulated and configured to monitor the virtual ground or common mode of the trio and thereby ascertain the DC level of received C-PHY signals and to respond immediately to changes in the DC level. The servo loop uses replica receiving circuits and can provide substantial power savings and occupies substantially less area of an IC than thick gate based level shifting stages.

Figure 11:
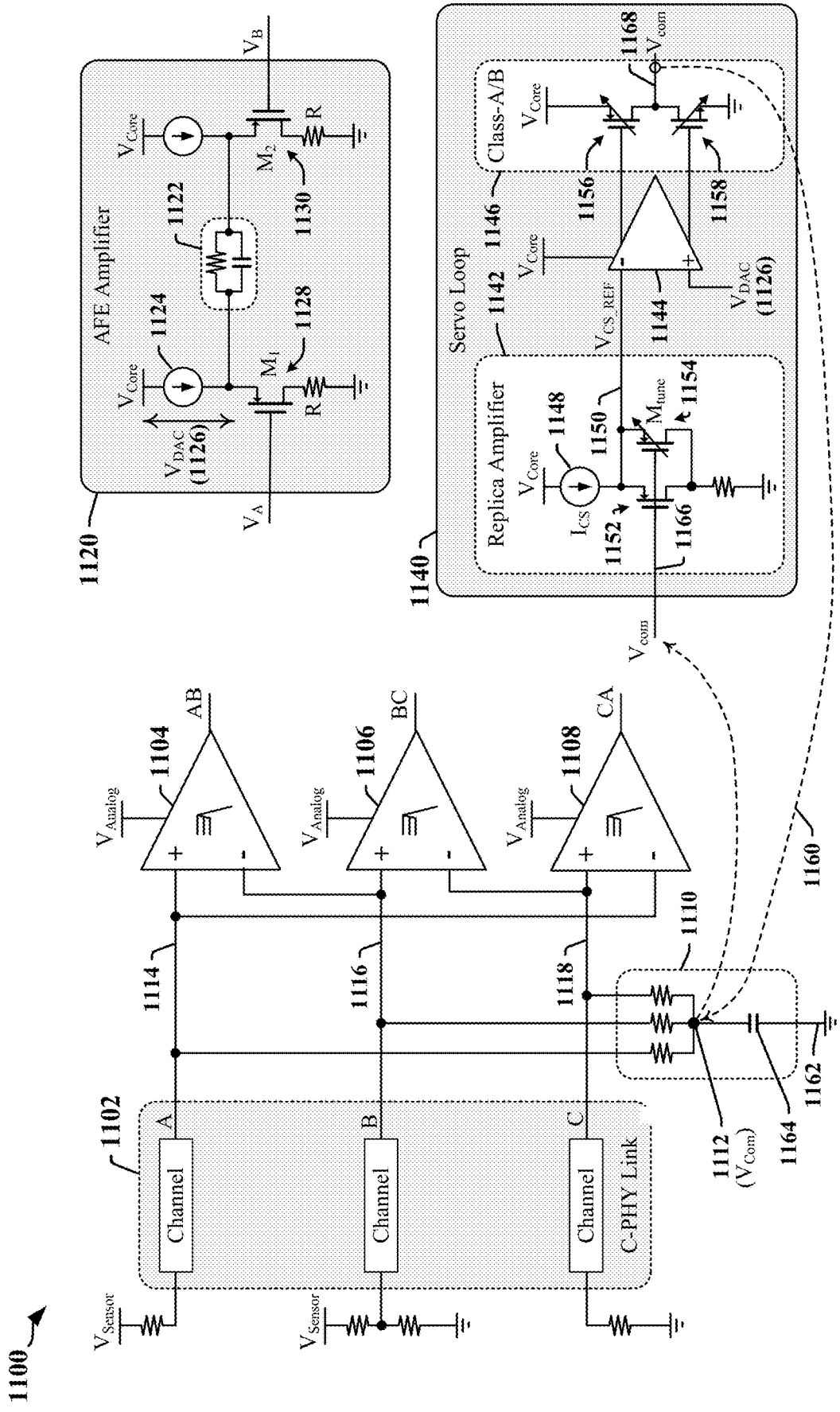
FIG. 11 illustrates certain aspects of a C-PHY interface that includes a servo loop configured to regulate DC levels in accordance with certain aspects of this disclosure.

FIG. 11 illustrates certain aspects of a C-PHY interface 1100 that includes a servo loop 1140 configured to regulate DC levels in accordance with certain aspects of this disclosure. The C-PHY interface 1100 is configured to couple a receiving device to a trio of wires 1114, 1116, 1118 of a C-PHY link 1102. Each of the wires 1114, 1116, 1118 is coupled through a resistance to common node 1112 in a terminating network 1110. The common node 1112 is decoupled from a ground reference 1162 for the C-PHY link 1102 through a capacitance 1164. Differential receivers 1104, 1106, 1108 are coupled to different pairs of the wires 1114, 1116, 1118. The common node 1112 serves as virtual ground for the differential receivers 1104, 1106, 1108 and signals received from the wires 1114, 1116, 1118 of the C-PHY link 1102.

Each of the differential receivers 1104, 1106, 1108 includes an automatic frequency equalization amplifier (the AFE amplifier 1120). In the illustrated example, the AFE amplifier 1120 includes P-type metal-oxide-semiconductor (PMOS) input transistors 1128, 1130 and a source degeneration circuit 1122 configured to provide automatic frequency equalization. The source degeneration circuit 1122 includes a source degeneration resistance coupled in parallel with a source degeneration capacitance between the sources of the input transistors 1128, 1130. The receiving stages of the amplifier 1120 include a current source 1124 that may be specified to operate when a voltage (VDAC 1126) across the current source 1124 has a minimum level. The amplifier 1120 may be configured to provide sufficient headroom for the current source 1124. In one example, the headroom is sufficient to accommodate a VDAC of 150 mV.

The C-PHY interface 1100 includes a servo loop 1140 configured to regulate common mode voltage for the trio of the C-PHY link 1102. The servo loop 1140 operates as a feedback circuit and includes a replica amplifier 1142, an error amplifier 1144 and an A/B amplifier 1146 and is configured to provide an injection current 1160 through the common node 1112. The replica amplifier 1142 is constructed from the same combination of active devices used to provide amplifiers that receive signals from the trio of the C-PHY link 1102 in the differential receivers 1104, 1106, 1108. The replica amplifier 1142 receives an input signal 1166 representative of the voltage ($V_{Com}$) at the common node 1112. The replica amplifier 1142 includes a current source and two transistors 1152, 1154. The bias of at least one of the two transistors 1152, 1154 can be adjusted, tuned or calibrated to obtain a desired response to the input signal 1166 representative of the voltage ($V_{Com}$) at a common node 1112. The output ($V_{CS\_REF}$ 1150) replica amplifier 1142 is provided as the input signal to the error amplifier 1144. The error amplifier 1144 may be implemented using a comparator or an operational amplifier. The error amplifier 1144 generates a differential feedback signal 1168 based on the difference between $V_{CS\_REF}$ 1150 and $V_{DAC}$ 1126. The differential feedback signal 1168 is provided to the transistors 1156, 1158 of the A/B amplifier 1146. The A/B amplifier 1146 generates an injection current 1160 that is injected through the common node 1112 that can stabilize and/or prevent drift in the voltage at the common node 1112. The transistors 1156, 1158 of the A/B amplifier 1146 may be tuned by controlling, adjusting or calibrating the bias provided to at least one of the transistors 1156, 1158.

The common node 1112 serves as a virtual ground between the trio and as the adjustment point for the servo loop 1140. The servo loop 1140 may configure the injection current 1160 to create the necessary headroom for current source 1148 in the replica amplifier 1142. In some examples, the current source 1148 is specified to operate with a nominal 150 mV for all operating conditions in the replica amplifier 1142. The injection current 1160 modifies the voltage levels of the signals received from the trio of wires 1114, 1116, 1118 of the C-PHY link 1102.

In some examples, the servo loop 1140 can reduce common mode noise and improve power supply ripple rejection. The servo loop 1140 may control the voltage at the common node 1112 based on a reference signal ($V_{CS\_REF}$ 1150). The voltage of the $V_{CS\_REF}$ 1150 may be adjusted through a tuning transistor 1154 ($M_{tune}$) and by controlling $V_{DAC}$ 1126.

The examples shown in FIG. 11 and other examples provided elsewhere in this disclosure describe receivers or components of receivers that employ PMOS technology for implementing certain transistors, including the input transistors 1128, 1130. The concepts disclosed herein are not limited to PMOS technology and can be readily implemented using N-type metal-oxide-semiconductor (NMOS) technology, complementary metal-oxide-semiconductor (CMOS) technology or another type of technology. For example, certain amplifiers, current sources, comparators and logic circuits can be implemented using NMOS transistors, PMOS transistors, CMOS transistors or some combination of NMOS transistors, PMOS and/or transistors CMOS transistors.

Figure 12:
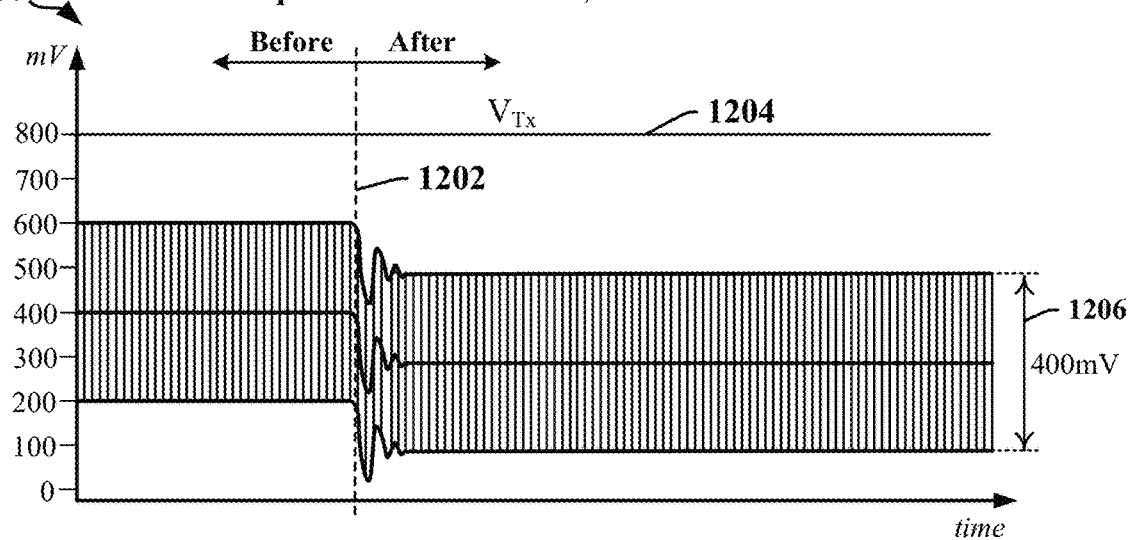
FIG. 12 illustrates a first example of the effect of a servo loop configured to regulate DC levels in a C-PHY interface according to certain aspects of this disclosure.
Figure 12:
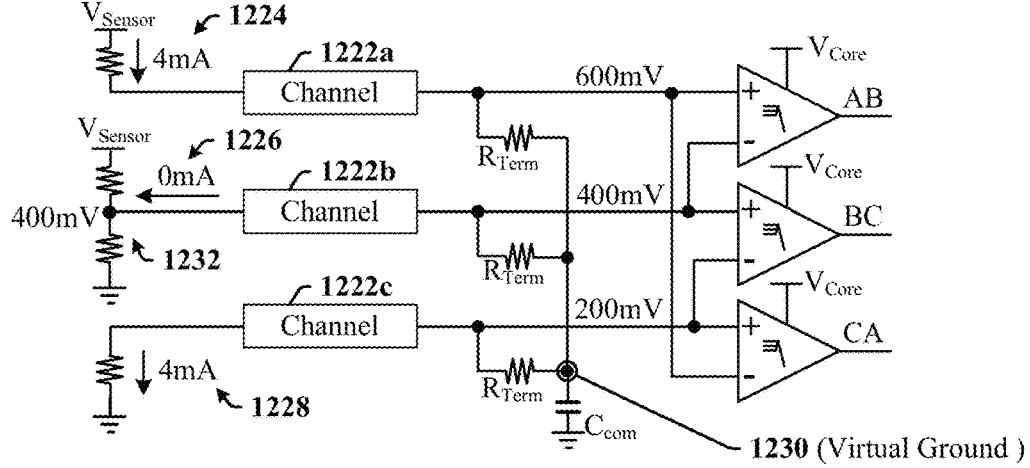
Figure 12:
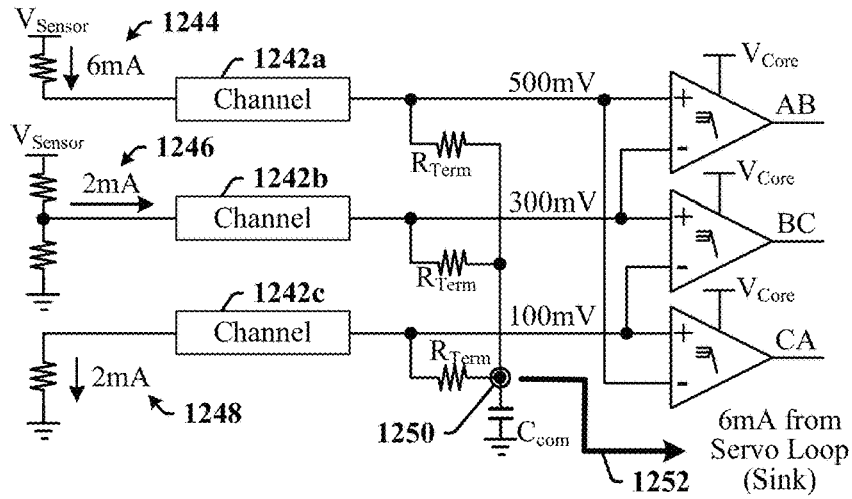

FIG. 12 illustrates a first example of the effect of a servo loop configured to regulate DC levels in a C-PHY interface according to certain aspects of this disclosure. In one example, the servo loop 1140 illustrated in FIG. 11 may be used to inject current through a common node 1112 that serves as virtual ground. FIG. 12 includes a graphical representation 1200 of signaling over the three channels 1222a-1222c or 1242a-1242c in a communication link operated in accordance with C-PHY specifications and protocols. The channels 1222a-1222c or 1242a-1242c may be provided by wires, printed circuit board interconnects, traces in metallization layers of an IC or other types of conductors. At a point in time 1202 a change occurs in the common mode voltage level of the three wires.

A first current flow diagram 1220 shows current and voltage levels in a receiver circuit that operates without a servo loop. The transmitter drives signals over the three channels 1222a, 1222b, 1222c with a peak voltage level 1204 ($V_{Tx}$) of 800 mV. At the receiving end, the signals received from the three channels 1222a, 1222b, 1222c have a 400 mV peak-to-peak voltage 1206. In the illustrated example, the common mode voltage level of the three channels 1222a, 1222b, 1222c drops from 400 mV to 300 mV. A first channel 1222a carries a first current 1224 from the transmitter at an amplitude of 4 mA, a second channel 1222b carries no or negligible current 1226 from the transmitter, and a third channel 1222c carries a second current 1228 from the receiver at an amplitude of 4 mA.

In the illustrated example, the transmitter is a sensor that has line drivers that nominally drive the channels 1222a, 1222b, 1222c between 0 and 800 mV. The mid-level voltage at the transmitter is 400 mV and the nominal voltage at the common node 1230 that serves as virtual ground is also 400 mV. Termination mismatches, variations associated with sensor usage or other factors affecting shifts in ground voltage may produce an event that causes the change in the common mode voltage at time 1202. As depicted, the change is a step change. In other examples, the change may occur more gradually. In conventional systems, level shifters may be required to accommodate the change in the common mode voltage.

A second current flow diagram 1240 shows current and voltage levels in a receiver circuit that includes a servo loop to automatically regulate common mode voltage. In the illustrated example, the servo loop may be configured to maintain a virtual ground voltage level of 300 mV. Here, the common node 1250 serves as virtual ground. The transmitter drives signals over the three channels 1242a, 1242b, 1242c with a peak voltage level 1204 ($V_{Tx}$) of 800 mV. The servo loop is configured to sink a 6 mA injection current 1252, resulting in a net current of 6 mA flowing through the first channel 1242a from the transmitter, a net current of 2 mA flowing through the second channel 1242b from the transmitter, and a net current of 2 mA flowing through third channel 1242c to the transmitter.

The servo loop may be configured to adjust the injection current 1252 to accommodate or mitigate for termination mismatches, variations associated with sensor usage or other factors affecting shifts in ground voltage may produce an event that causes the change in the common mode voltage at time 1202. As depicted, the change is a step change. In other examples, the change may occur more gradually.

Figure 13:
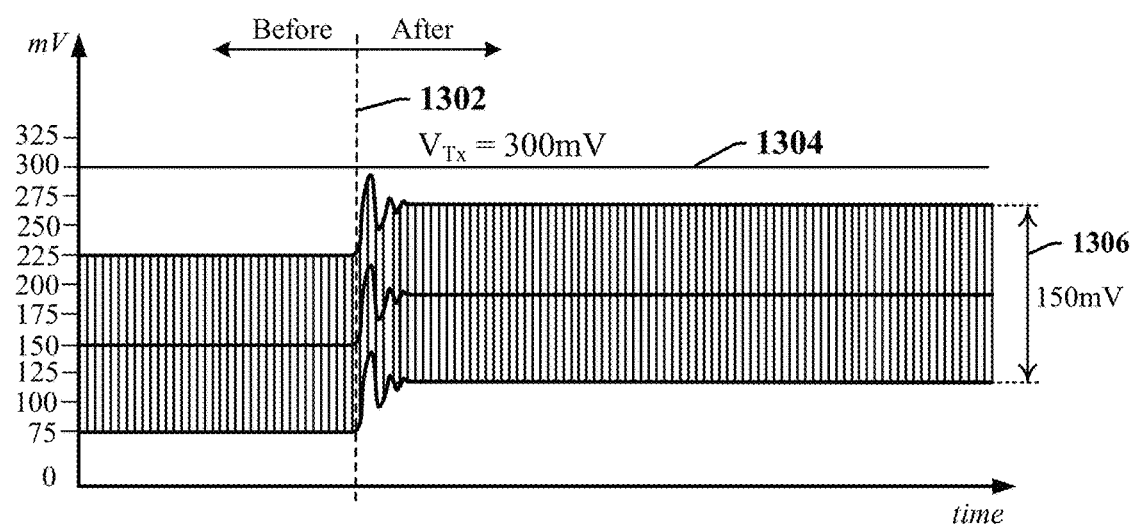
FIG. 13 illustrates a second example of the effect of a servo loop configured to regulate DC levels in a C-PHY interface according to certain aspects of this disclosure.
Figure 13:
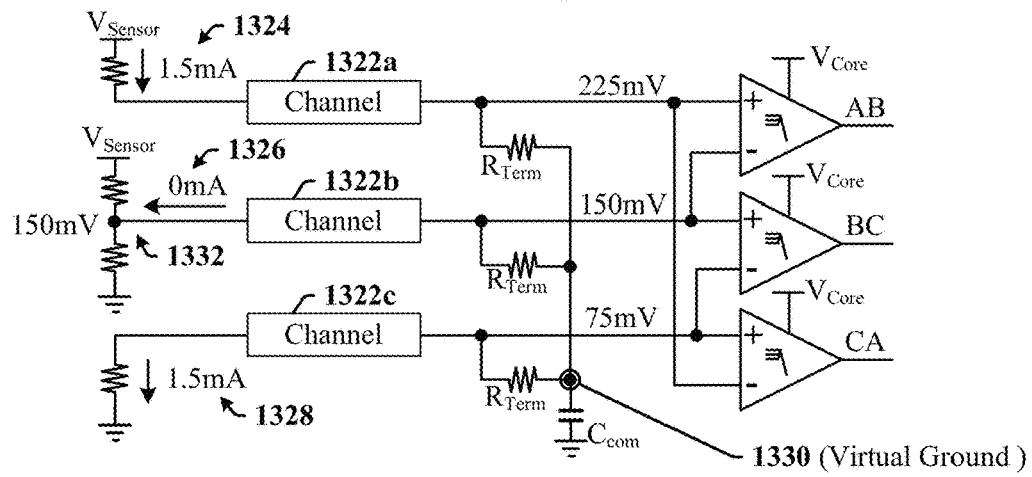
Figure 13:
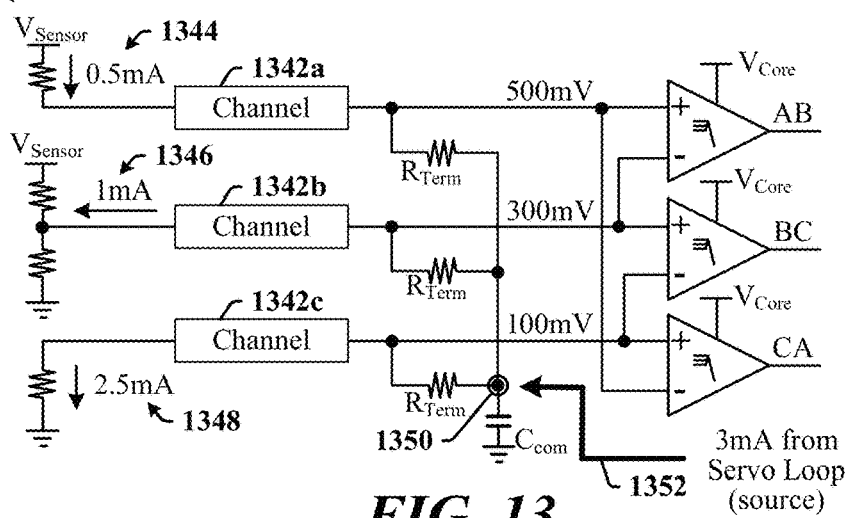

FIG. 13 illustrates a second example of the effect of a servo loop configured to regulate DC levels in a C-PHY interface according to certain aspects of this disclosure. In some instances, the servo loop 1140 illustrated in FIG. 11 may be used to inject current through a common node 1112 that serves as virtual ground. FIG. 13 includes a graphical representation 1300 of signaling over the three channels 1322a-1322c or 1342a-1342c in a communication link operated in accordance with C-PHY specifications and protocols. The channels 1322a-1322c or 1342a-1342c may be provided by wires, printed circuit board interconnects, traces in metallization layers of an IC or other types of conductors. At a point in time 1302 a change occurs in the common mode voltage level of the three wires.

A first current flow diagram 1320 shows current and voltage levels in a receiver circuit that operates without a servo loop. The transmitter drives signals over the three channels 1322a, 1322b, 1322c with a peak voltage level 1304 ($V_{Tx}$) of 300 mV. At the receiving end, the signals received from the three channels 1322a, 1322b, 1322c have a 150 mV peak-to-peak voltage 1306. In the illustrated example, the common mode voltage level of the three channels 1322a, 1322b, 1322c increases from 150 mV to 200 mV. A first channel 1322a carries a first current 1324 from the transmitter at an amplitude of 1.5 mA, a second channel 1322b carries no or negligible current 1326 from the transmitter, and a third channel 1322c carries a second current 1328 from the receiver at an amplitude of 1.5 mA.

In the illustrated example, the transmitter is a sensor that has line drivers that nominally drive the channels 1322a, 1322b, 1322c between 0 and 300 mV. The mid-level voltage at the transmitter is 150 mV and the nominal voltage at the common node 1330 that serves as virtual ground is also 150 mV. Termination mismatches, variations associated with sensor usage or other factors affecting shifts in ground voltage may produce an event that causes the change in the common mode voltage at time 1302. As depicted, the change is a step change. In other examples, the change may occur more gradually. In conventional systems, level shifters may be required to accommodate the change common mode voltage.

A second current flow diagram 1340 shows current and voltage levels in a receiver circuit that includes a servo loop to automatically regulate common mode voltage. In the illustrated example, the servo loop may be configured to maintain a virtual ground voltage level of 200 mV. Here, the common node 1350 serves as virtual ground. The transmitter drives signals over the three channels 1342a, 1342b, 1342c with a peak voltage level 1304 ($V_{Tx}$) of 300 mV. The servo loop is configured to source a 3 mA injection current 1352, resulting in a net current 1344 of 0.5 mA flowing through the first channel 1342a from the transmitter, a net current 1346 of 1 mA flowing through the second channel 1342b to the transmitter, and a net current 1348 of 2.5 mA flowing through third channel 1342c to the transmitter.

The servo loop may be configured to adjust the injection current 1352 to accommodate or mitigate for termination mismatches, variations associated with sensor usage or other factors affecting shifts in ground voltage may produce an event that causes the change in the common mode voltage at time 1302. As depicted, the change is a step change. In other examples, the change may occur more gradually.

According to certain aspects of the disclosure, the voltage of the line driver output at the transmitter need not change when the voltage at the common node 1250, 1350 is less than half the maximum voltage of the line driver output. In some instances, a servo loop may be configured to increase the voltage at the common node 1250, 1350 to more than half the maximum voltage of the line driver output and the voltage levels of line driver output may be altered slightly. For example, in the example illustrated in the second current flow diagram 1340, the voltage range of the line driver output may be modified by up to 10% in order to maintain the symmetry of termination between the transmitter and receiver.

In some implementations, the voltage at the common node 1250, 1350 may be configured during calibration of the receiver. C-PHY protocols provide for preambles that can be used for such calibration. The voltage measured at the common node 1250, 1350 may be incrementally increased until the voltage measured at the common node 1250, 1350 is equal to or greater than half the maximum voltage of the line driver output. The injection current may then be reduced by two increments. In one example, the voltage at the common node 1250, 1350 may be adjusted by modifying the voltage ($V_{DAC}$) across the current source 1124.

In some implementations, the use of servo loop can accommodate the wide common mode requirement of the C-PHY interface using less power and area on an IC than conventional level-shifting techniques. In one example, a conventional receiver may require 780 um$^2$×9 thick-gate level shifters for three trios, and may consume between 1 and 1.2 mA for each of 9 channels. The use of a servo loop in accordance with certain aspects of this disclosure can limit the area used on an IC to 200 um$^2$ for each of 3 trios and may reduce current usage to less than 10 mA. The servo loop can eliminate the need for a thick gate based level shifter and can support higher bandwidths.

Examples of Processing Circuits and Methods

Figure 14:
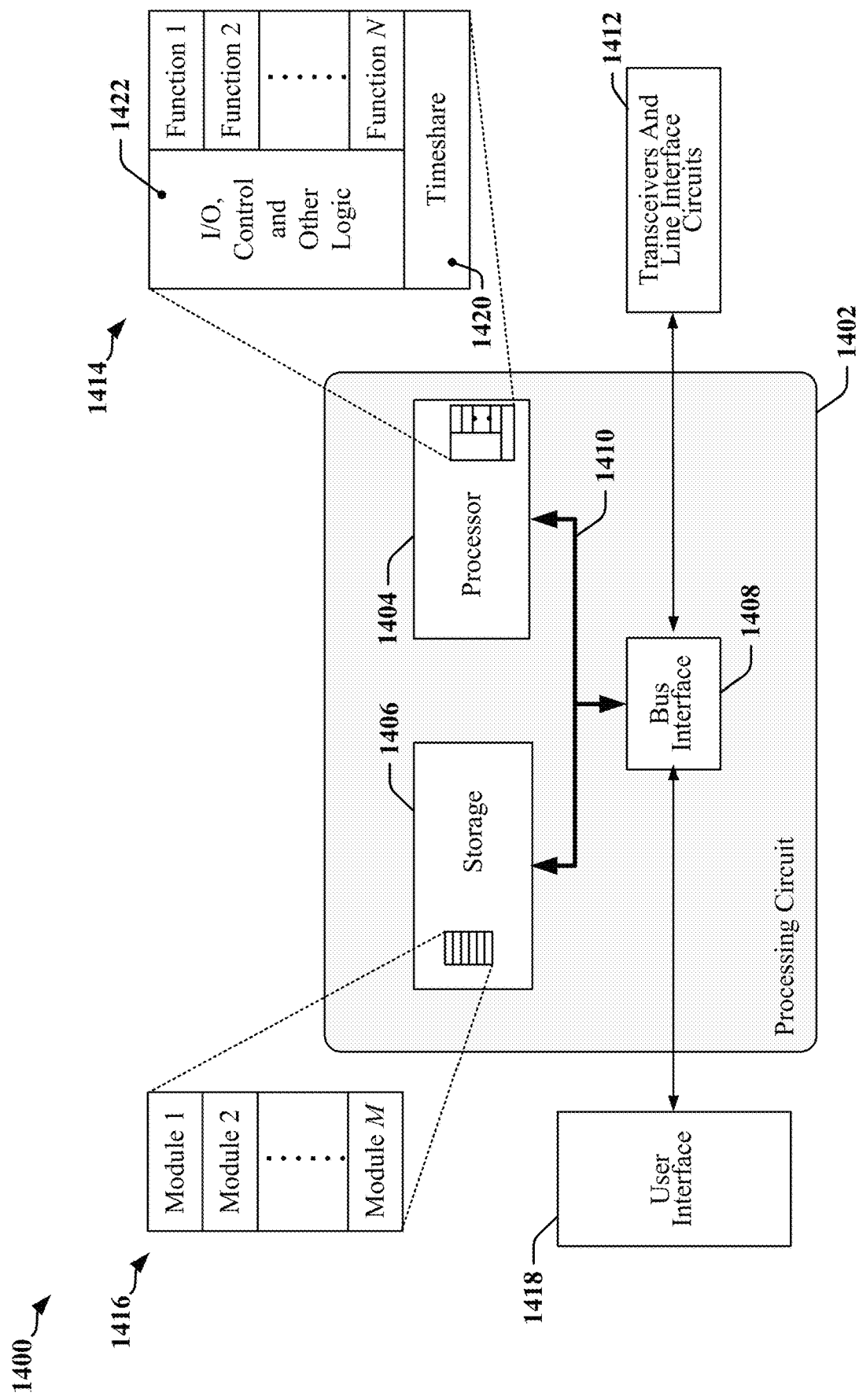
FIG. 14 illustrates an example of an apparatus employing a processing circuit that may be adapted according to certain aspects disclosed herein.

FIG. 14 is a conceptual diagram 1400 illustrating an example of a hardware implementation for an apparatus employing a processing circuit 1402 that may be configured to perform one or more functions disclosed herein. In accordance with various aspects of the disclosure, an element, or any portion of an element, or any combination of elements as disclosed herein may be implemented using the processing circuit 1402. The processing circuit 1402 may include certain devices, circuits, and/or logic that support the various encoding schemes disclosed herein. The processing circuit 1402 may include, configure and/or manage one or more of the circuits illustrated in FIGS. 19 and 21-27. In one example, the processing circuit 1402 may include some combination of circuitry and modules that facilitates the sampling and decoding of symbols that are encoded using C-PHY encoding, and which define three or more voltage levels on the wires of a serial bus. In another example, the processing circuit 1402 may include some combination of circuitry and modules that facilitates the generation of clock signals that can control efficient capture of C-PHY encoded symbols in accordance with certain aspects disclosed herein. The processing circuit 1402 may include a state machine or another type of processing device that manages encoding and/or decoding processes as disclosed herein.

The processing circuit 1402 may include one or more processors 1404 that are controlled by some combination of hardware and software modules. Examples of processors 1404 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 1404 may include specialized processors that perform specific functions, and that may be configured, augmented or controlled by one of the software modules 1416. The one or more processors 1404 may be configured through a combination of software modules 1416 loaded during initialization, and further configured by loading or unloading one or more software modules 1416 during operation.

In the illustrated example, the processing circuit 1402 may be implemented with a bus architecture, represented generally by the bus 1410. The bus 1410 may include any number of interconnecting buses and bridges depending on the specific application of the processing circuit 1402 and the overall design constraints. The bus 1410 links together various circuits including the one or more processors 1404, and a processor-readable storage medium 1406. The processor-readable storage medium 1406 may include memory devices and mass storage devices, and may be referred to herein as computer-readable media and/or processor-readable media. The bus 1410 may also link various other circuits such as timing sources, timers, peripherals, voltage regulators, and power management circuits. A bus interface 1408 may provide an interface between the bus 1410 and one or more transceivers 1412. A transceiver 1412 may be provided for each networking technology supported by the processing circuit. In some instances, multiple networking technologies may share some or all of the circuitry or processing modules found in a transceiver 1412. Each transceiver 1412 provides a means for communicating with various other apparatus over a transmission medium. Depending upon the nature of the apparatus, a user interface 1418 (e.g., keypad, display, speaker, microphone, joystick) may also be provided, and may be communicatively coupled to the bus 1410 directly or through the bus interface 1408.

A processor 1404 may be responsible for managing the bus 1410 and for general processing that may include the execution of software stored in a processor-readable medium that may include the processor-readable storage medium 1406. In this respect, the processing circuit 1402, including the processor 1404, may be used to implement any of the methods, functions and techniques disclosed herein. The processor-readable storage medium 1406 may be used for storing data that is manipulated by the processor 1404 when executing software, and the software may be configured to implement any one of the methods disclosed herein.

One or more processors 1404 in the processing circuit 1402 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the processor-readable storage medium 1406 or in another, external processor-readable medium. The processor-readable storage medium 1406 may include a non-transitory processor-readable medium. A non-transitory processor-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, a ROM, a PROM, an erasable PROM (EPROM), an EEPROM, a register, a removable disk, and any other suitable medium for storing software and/or instructions that may be accessed and read by a computer. The processor-readable storage medium 1406 may also include, by way of example, a carrier wave, a transmission line, and any other suitable medium for transmitting software and/or instructions that may be accessed and read by a computer. Processor-readable storage medium 1406 may reside in the processing circuit 1402, in the processor 1404, external to the processing circuit 1402, or be distributed across multiple entities including the processing circuit 1402. The processor-readable storage medium 1406 may be embodied in a computer program product. By way of example, a computer program product may include a processor-readable medium in packaging materials. Those skilled in the art will recognize how best to implement the described functionality presented throughout this disclosure depending on the particular application and the overall design constraints imposed on the overall system.

The processor-readable storage medium 1406 may maintain software maintained and/or organized in loadable code segments, modules, applications, programs, etc., which may be referred to herein as software modules 1416. Each of the software modules 1416 may include instructions and data that, when installed or loaded on the processing circuit 1402 and executed by the one or more processors 1404, contribute to a run-time image 1414 that controls the operation of the one or more processors 1404. When executed, certain instructions may cause the processing circuit 1402 to perform functions in accordance with certain methods, algorithms and processes described herein.

Some of the software modules 1416 may be loaded during initialization of the processing circuit 1402, and these software modules 1416 may configure the processing circuit 1402 to enable performance of the various functions disclosed herein. For example, some software modules 1416 may configure internal devices and/or logic circuits 1422 of the processor 1404, and may manage access to external devices such as the transceiver 1412, the bus interface 1408, the user interface 1418, timers, mathematical coprocessors, and so on. The software modules 1416 may include a control program and/or an operating system that interacts with interrupt handlers and device drivers, and that controls access to various resources provided by the processing circuit 1402. The resources may include memory, processing time, access to the transceiver 1412, the user interface 1418, and so on.

One or more processors 1404 of the processing circuit 1402 may be multifunctional, whereby some of the software modules 1416 are loaded and configured to perform different functions or different instances of the same function. The one or more processors 1404 may additionally be adapted to manage background tasks initiated in response to inputs from the user interface 1418, the transceiver 1412, and device drivers, for example. To support the performance of multiple functions, the one or more processors 1404 may be configured to provide a multitasking environment, whereby each of a plurality of functions is implemented as a set of tasks serviced by the one or more processors 1404 as needed or desired. In one example, the multitasking environment may be implemented using a timesharing program 1420 that passes control of a processor 1404 between different tasks, whereby each task returns control of the one or more processors 1404 to the timesharing program 1420 upon completion of any outstanding operations and/or in response to an input such as an interrupt. When a task has control of the one or more processors 1404, the processing circuit is effectively specialized for the purposes addressed by the function associated with the controlling task. The timesharing program 1420 may include an operating system, a main loop that transfers control on a round-robin basis, a function that allocates control of the one or more processors 1404 in accordance with a prioritization of the functions, and/or an interrupt driven main loop that responds to external events by providing control of the one or more processors 1404 to a handling function.

Figure 15:
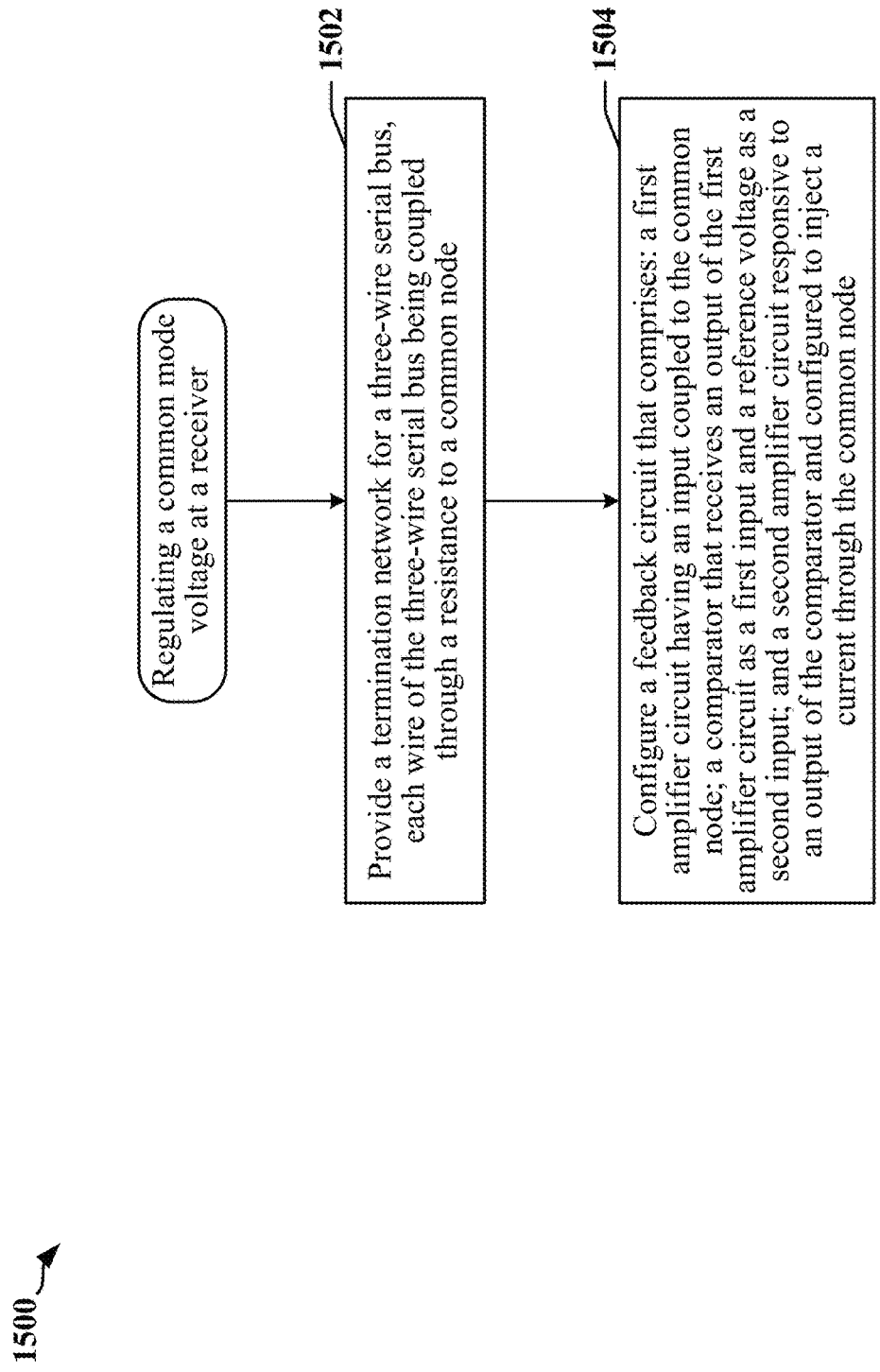
FIG. 15 is a flow chart of a method for regulating a common mode voltage at a C-PHY receiver according to certain aspects disclosed herein.

FIG. 15 is a flow chart 1500 of a method for regulating a common mode voltage at a receiver coupled to a multi-wire communication link according to certain aspects of this disclosure. In one example, the communication link may have three wires and data may be encoded in phase state and polarity of a signal transmitted in different phases on each of the three wires. At block 1502, a terminating network is provided for a three-wire serial bus. Each wire of the three-wire serial bus may be coupled through a resistance to a common node of the terminating network. At block 1504, a feedback circuit may be configured. The feedback circuit includes a first amplifier circuit that has an input coupled to the common node. The feedback circuit includes a comparator that receives an output of the first amplifier circuit as a first input and a reference voltage as a second input. The feedback circuit includes a second amplifier circuit responsive to an output of the comparator and configured to inject a current through the common node. The three-wire serial bus may be operated in accordance with a C-PHY protocol. The terminating network may include a capacitance configured to couple the common node to ground. In one example, each of a plurality of differential receivers coupled to different pairs of wires of the three-wire serial bus includes an amplifier circuit corresponding to the first amplifier circuit.

In certain examples, the first amplifier circuit and the second amplifier circuit include tunable transistors configured to set a voltage level at the common node. The feedback circuit may be configured to regulate a voltage level at the common node based on amplitude of the injection current. The voltage level at the common node may be calibrated during transmission of a preamble over the three-wire serial bus in accordance with a C-PHY protocol. The voltage level at the common node may be calibrated to be less than half a nominal peak-to-peak voltage of a signal to be transmitted by a transmitter over the three-wire serial bus.

In one example, the method includes equalizing inputs to a differential receiver.

In one aspect of the disclosure, an apparatus may have means for terminating a three-wire serial bus and means for regulating a common mode voltage level. The means for terminating a three-wire serial bus may be configured to couple each wire of the three-wire serial bus through a resistance to a common node. The means for terminating the three-wire serial bus may include a capacitance configured to couple the common node to ground. The three-wire serial bus may be operated in accordance with a C-PHY protocol.

The means for regulating a common mode voltage level may include a feedback circuit having a first amplifier circuit having an input coupled to the common node, a comparator that receives an output of the first amplifier circuit as a first input and a reference voltage as a second input, and a second amplifier circuit responsive to an output of the comparator and configured to inject a current through the common node.

The apparatus may include means for decoding data from the three-wire serial bus. The means for decoding data may include a plurality of differential receivers coupled to different pairs of wires of the three-wire serial bus. The first amplifier circuit has a combination of active devices that matches a corresponding combination of active devices in an amplifier in each of the plurality of differential receivers. The first amplifier circuit and the second amplifier circuit may include tunable transistors configured to set a voltage level at the common node. The feedback circuit may be configured to regulate the voltage level at the common node based on amplitude of the injection current. The voltage level at the common node may be calibrated during transmission of a preamble over the three-wire serial bus in accordance with a C-PHY protocol. The voltage level at the common node may be calibrated to be less than half a nominal peak-to-peak voltage of a signal to be transmitted by a transmitter over the three-wire serial bus.

In certain examples, the apparatus includes means for equalizing inputs to a differential receiver. The means for equalizing inputs to the differential receiver may include a plurality of NMOS input transistors; and a source degeneration circuit.

In some examples, a receiving apparatus has a terminating network for a three-wire serial bus and a feedback circuit. Each wire of the three-wire serial bus may be coupled through a resistance to a common node of the terminating network. The terminating network may have a capacitance configured to couple the common node to ground. The feedback circuit may be configured to regulate the voltage level at the common node based on amplitude of the injection current.

The feedback circuit may have a first amplifier circuit having an input coupled to the common node, a comparator that receives an output of the first amplifier circuit as a first input and a reference voltage as a second input, and a second amplifier circuit responsive to an output of the comparator and configured to inject a current through the common node. The first amplifier circuit and the second amplifier circuit may include tunable transistors configured to set a voltage level at the common node.

The receiving apparatus may include a plurality of differential receivers coupled to different pairs of wires of the three-wire serial bus. The first amplifier circuit has a combination of active devices that matches a corresponding combination of active devices in an amplifier in each of the plurality of differential receivers.

The voltage level at the common node may calibrated during transmission of a preamble over the three-wire serial bus in accordance with a C-PHY protocol. The voltage level at the common node may be calibrated to be less than half a nominal peak-to-peak voltage of a signal to be transmitted by a transmitter over the three-wire serial bus.

Some implementation examples are described in the following numbered clauses:

1. A receiving apparatus, comprising: a terminating network for a three-wire serial bus, each wire of the three-wire serial bus being coupled through a resistance to a common node of the terminating network; and a feedback circuit comprising: a first amplifier circuit having an input coupled to the common node; a comparator that receives an output of the first amplifier circuit as a first input and a reference voltage as a second input; and a second amplifier circuit responsive to an output of the comparator and configured to inject a current through the common node.

2. The apparatus as described in clause 1, wherein the three-wire serial bus is operated in accordance with a C-PHY protocol.

3. The apparatus as described in clause 1 or clause 2, wherein the terminating network comprises: a capacitance configured to couple the common node to ground.

4. The apparatus as described in any of clauses 1-3, further comprising: a plurality of differential receivers coupled to different pairs of wires of the three-wire serial bus, wherein the first amplifier circuit has a combination of active devices that matches a corresponding combination of active devices in an amplifier in each of the plurality of differential receivers.

5. The apparatus as described in any of clauses 1-4, wherein the first amplifier circuit and the second amplifier circuit comprise tunable transistors configured to set a voltage level at the common node.

6. The apparatus as described in any of clauses 1-5, wherein the feedback circuit is configured to regulate a voltage level at the common node based on amplitude of the injection current.

7. The apparatus as described in any of clauses 1-6, wherein a voltage level at the common node is calibrated during transmission of a preamble over the three-wire serial bus in accordance with a C-PHY protocol.

8. The apparatus as described in clause 7, wherein the voltage level at the common node is calibrated to be less than half a nominal peak-to-peak voltage of a signal to be transmitted by a transmitter over the three-wire serial bus.

9. The apparatus as described in any of clauses 1-8, further comprising: a third amplifier configured with an automatic frequency equalization circuit.

10. The apparatus as described in clause 9, wherein the third amplifier comprises: a plurality of N-type metal-oxide-semiconductor input transistors; and a source degeneration circuit.

11. An apparatus, comprising: means for terminating a three-wire serial bus, configured to couple each wire of the three-wire serial bus through a resistance to a common node; and means for regulating a common mode voltage level, including a feedback circuit comprising: a first amplifier circuit having an input coupled to the common node; a comparator that receives an output of the first amplifier circuit as a first input and a reference voltage as a second input; and a second amplifier circuit responsive to an output of the comparator and configured to inject a current through the common node.

12. The apparatus as described in clause 11, wherein the three-wire serial bus is operated in accordance with a C-PHY protocol.

13. The apparatus as described in clause 11 or clause 12, wherein the means for terminating the three-wire serial bus comprises: a capacitance configured to couple the common node to ground.

14. The electronic device as described in any of clauses 11-13, further comprising: means for decoding data from the three-wire serial bus, including a plurality of differential receivers coupled to different pairs of wires of the three-wire serial bus, wherein the first amplifier circuit has a combination of active devices that matches a corresponding combination of active devices in an amplifier in each of the plurality of differential receivers.

15. The electronic device as described in any of clauses 11-14, wherein the first amplifier circuit and the second amplifier circuit comprise tunable transistors configured to set a voltage level at the common node.
16. The electronic device as described as described in any of clauses 11-15, wherein the feedback circuit is configured to regulate a voltage level at the common node based on amplitude of the injection current.
17. The electronic device as described as described in any of clauses 11-16, wherein a voltage level at the common node is calibrated during transmission of a preamble over the three-wire serial bus in accordance with a C-PHY protocol.
18. The electronic device as described in clause 17, wherein the voltage level at the common node is calibrated to be less than half a nominal peak-to-peak voltage of a signal to be transmitted by a transmitter over the three-wire serial bus.
19. The electronic device as described as described in any of clauses 11-18, further comprising: means for equalizing inputs to a differential receiver.
20. The electronic device as described in clause 19, wherein the means for equalizing inputs to the differential receiver comprises: a plurality of N-type metal-oxide-semiconductor input transistors; and a source degeneration circuit.
21. A method for regulating a common mode voltage at a receiver, comprising: providing a terminating network for a three-wire serial bus, each wire of the three-wire serial bus being coupled through a resistance to a common node of the terminating network; and configuring a feedback circuit that comprises: a first amplifier circuit having an input coupled to the common node; a comparator that receives an output of the first amplifier circuit as a first input and a reference voltage as a second input; and a second amplifier circuit responsive to an output of the comparator and configured to inject a current through the common node.
22. The method as described in clause 21, wherein the three-wire serial bus is operated in accordance with a C-PHY protocol.
23. The method as described in clause 21 or clause 22, wherein the terminating network comprises: a capacitance configured to couple the common node to ground.
24. The method as described in any of clauses 21-23, wherein each of a plurality of differential receivers is coupled to different pairs of wires of the three-wire serial bus, and wherein the first amplifier circuit has a combination of active devices that matches a corresponding combination of active devices in an amplifier in each of the plurality of differential receivers.
25. The method as described in any of clauses 21-24, wherein the first amplifier circuit and the second amplifier circuit comprise tunable transistors configured to set a voltage level at the common node.
26. The method as described in any of clauses 21-25, wherein the feedback circuit is configured to regulate a voltage level at the common node based on amplitude of the injection current.
27. The method as described in any of clauses 21-26, wherein a voltage level at the common node is calibrated during transmission of a preamble over the three-wire serial bus in accordance with a C-PHY protocol.
28. The method as described in clause 27, wherein the voltage level at the common node is calibrated to be less than half a nominal peak-to-peak voltage of a signal to be transmitted by a transmitter over the three-wire serial bus.
29. The method as described in as described in any of clauses 21-22, further comprising: equalizing inputs to a differential receiver.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:
1. A receiving apparatus, comprising:
   a terminating network for a three-wire serial bus, each wire of the three-wire serial bus being coupled through a resistance to a common node of the terminating network; and
   a feedback circuit comprising:
      a first amplifier circuit having an input coupled to the common node;
      a comparator that receives an output of the first amplifier circuit as a first input and a reference voltage as a second input; and
      a second amplifier circuit responsive to an output of the comparator and configured to inject a current through the common node.
2. The apparatus of claim 1, wherein the three-wire serial bus is operated in accordance with a C-PHY protocol.
3. The apparatus of claim 1, wherein the terminating network comprises:
   a capacitance configured to couple the common node to ground.
4. The apparatus of claim 1, further comprising:
   a plurality of differential receivers coupled to different pairs of wires of the three-wire serial bus, wherein the first amplifier circuit has a combination of active devices that matches a corresponding combination of active devices in an amplifier in each of the plurality of differential receivers.

5. The apparatus of claim 1, wherein the first amplifier circuit and the second amplifier circuit comprise tunable transistors configured to set a voltage level at the common node.

6. The apparatus of claim 1, wherein the feedback circuit is configured to regulate a voltage level at the common node based on amplitude of the current injected through the common node.

7. The apparatus of claim 1, wherein a voltage level at the common node is calibrated during transmission of a preamble over the three-wire serial bus in accordance with a C-PHY protocol.

8. The apparatus of claim 7, wherein the voltage level at the common node is calibrated to be less than half a nominal peak-to-peak voltage of a signal to be transmitted by a transmitter over the three-wire serial bus.

9. The apparatus of claim 1, further comprising:
a third amplifier configured with an automatic frequency equalization circuit.

10. The apparatus of claim 9, wherein the third amplifier comprises:
a plurality of P-type metal oxide-semiconductor input transistors; and
a source degeneration circuit.

11. An apparatus, comprising:
means for terminating a three-wire serial bus, configured to couple each wire of the three-wire serial bus through a resistance to a common node; and
means for regulating a common mode voltage level, including a feedback circuit comprising:
a first amplifier circuit having an input coupled to the common node;
a comparator that receives an output of the first amplifier circuit as a first input and a reference voltage as a second input; and
a second amplifier circuit responsive to an output of the comparator and configured to inject a current through the common node.

12. The apparatus of claim 11, wherein the three-wire serial bus is operated in accordance with a C-PHY protocol.

13. The apparatus of claim 11, wherein the means for terminating the three-wire serial bus comprises:
a capacitance configured to couple the common node to ground.

14. The apparatus of claim 11, further comprising:
means for decoding data from the three-wire serial bus, including a plurality of differential receivers coupled to different pairs of wires of the three-wire serial bus, wherein the first amplifier circuit has a combination of active devices that matches a corresponding combination of active devices in an amplifier in each of the plurality of differential receivers.

15. The apparatus of claim 11, wherein the first amplifier circuit and the second amplifier circuit comprise tunable transistors configured to set a voltage level at the common node.

16. The apparatus of claim 11, wherein the feedback circuit is configured to regulate a voltage level at the common node based on amplitude of the current injected through the common node.

17. The apparatus of claim 11, wherein a voltage level at the common node is calibrated during transmission of a preamble over the three-wire serial bus in accordance with a C-PHY protocol.

18. The apparatus of claim 17, wherein the voltage level at the common node is calibrated to be less than half a nominal peak-to-peak voltage of a signal to be transmitted by a transmitter over the three-wire serial bus.

19. The apparatus of claim 11, further comprising:
means for equalizing inputs to a differential receiver.

20. The apparatus of claim 19, wherein the means for equalizing inputs to the differential receiver comprises:
a plurality of N-type metal-oxide-semiconductor input transistors; and
a source degeneration circuit.

21. A method for regulating a common mode voltage at a receiver, comprising:
providing a terminating network for a three-wire serial bus, each wire of the three-wire serial bus being coupled through a resistance to a common node of the terminating network; and
configuring a feedback circuit that comprises:
a first amplifier circuit having an input coupled to the common node;
a comparator that receives an output of the first amplifier circuit as a first input and a reference voltage as a second input; and
a second amplifier circuit responsive to an output of the comparator and configured to inject a current through the common node.

22. The method of claim 21, wherein the three-wire serial bus is operated in accordance with a C-PHY protocol.

23. The method of claim 21, wherein the terminating network comprises:
a capacitance configured to couple the common node to ground.

24. The method of claim 21, wherein each of a plurality of differential receivers is coupled to different pairs of wires of the three-wire serial bus, and wherein the first amplifier circuit has a combination of active devices that matches a corresponding combination of active devices in an amplifier in each of the plurality of differential receivers.

25. The method of claim 21, wherein the first amplifier circuit and the second amplifier circuit comprise tunable transistors configured to set a voltage level at the common node.

26. The method of claim 21, wherein the feedback circuit is configured to regulate a voltage level at the common node based on amplitude of the current injected through the common node.

27. The method of claim 21, wherein a voltage level at the common node is calibrated during transmission of a preamble over the three-wire serial bus in accordance with a C-PHY protocol.

28. The method of claim 27, wherein the voltage level at the common node is calibrated to be less than half a nominal peak-to-peak voltage of a signal to be transmitted by a transmitter over the three-wire serial bus.

29. The method of claim 21, further comprising:
equalizing inputs to a differential receiver.

* * * * *